US 8,426,870 B2

(12) United States Patent
Kanegae et al.

(10) Patent No.: US 8,426,870 B2
(45) Date of Patent: Apr. 23, 2013

(54) THIN-FILM TRANSISTOR ARRAY DEVICE, EL DISPLAY PANEL, EL DISPLAY DEVICE, THIN-FILM TRANSISTOR ARRAY DEVICE MANUFACTURING METHOD, EL DISPLAY PANEL MANUFACTURING METHOD

(75) Inventors: Arinobu Kanegae, Kyoto (JP); Genshiro Kawachi, Chiba (JP)

(73) Assignees: Panasonic Corporation, Osaka (JP); Panasonic Liquid Crystal Display Co., Ltd., Hyogo (JP)

( * ) Notice: Subject to any disclaimer, the term of this patent is extended or adjusted under 35 U.S.C. 154(b) by 0 days.

(21) Appl. No.: 13/245,256

(22) Filed: Sep. 26, 2011

(65) Prior Publication Data

US 2012/0074421 A1 Mar. 29, 2012

Related U.S. Application Data

(63) Continuation of application No. PCT/JP2010/005717, filed on Sep. 21, 2010.

(51) Int. Cl.
*H01L 27/14* (2006.01)
*H01L 21/84* (2006.01)

(52) U.S. Cl.
USPC .......... 257/72; 257/40; 257/59; 257/E31.095; 438/99; 438/149; 345/76; 345/92

(58) Field of Classification Search ............. 257/40, 257/59, 72, E31.095; 438/34, 82, 99, 142; 345/76, 92
See application file for complete search history.

(56) References Cited

U.S. PATENT DOCUMENTS

| 5,529,951 A | 6/1996 | Noguchi et al. | |
| 5,684,365 A * | 11/1997 | Tang et al. | ................. 315/169.3 |
| 5,869,803 A | 2/1999 | Noguchi et al. | |
| 6,071,765 A | 6/2000 | Noguchi et al. | |

(Continued)

FOREIGN PATENT DOCUMENTS

| JP | 07-235490 | 9/1995 |
| JP | 2004-311418 | 11/2004 |

(Continued)

OTHER PUBLICATIONS

U.S. Appl. No. 13/247,254 to Arinobu Kanegae et al., which was filed on Sep. 28, 2011.

(Continued)

*Primary Examiner* — Kenneth Parker
*Assistant Examiner* — Jose R Diaz
(74) *Attorney, Agent, or Firm* — Greenblum & Bernstein, P.L.C.

(57) ABSTRACT

A thin-film transistor array device includes a passivation film above first and second bottom gate transistors. A source wire is below the passivation film. A gate wire and a relay electrode are above the passivation film. The gate wire is electrically connected to a gate electrode of the first transistor via a first hole in the passivation film. A conductive oxide film is between the passivation film and both the gate wire and the relay electrode and not electrically connected between the gate wire and the relay electrode. The conductive oxide film covers an end portion of the source wire that is exposed via a second hole in the passivation film. The conductive oxide film is between the relay electrode and a current-supply electrode of the second transistor and electrically connects the relay electrode and the current-supply electrode via a third hole in the passivation film.

23 Claims, 26 Drawing Sheets

U.S. PATENT DOCUMENTS

| | | | |
|---|---|---|---|
| 8,184,224 B2 * | 5/2012 | Asano et al. | 349/43 |
| 2004/0201019 A1 * | 10/2004 | Kim et al. | 257/59 |
| 2004/0241931 A1 | 12/2004 | Akimoto et al. | |
| 2005/0116905 A1 * | 6/2005 | Kim et al. | 345/76 |
| 2005/0231670 A1 | 10/2005 | Hashiguchi et al. | |
| 2005/0285107 A1 * | 12/2005 | Koo et al. | 257/59 |
| 2006/0214168 A1 | 9/2006 | Akimoto et al. | |
| 2008/0136989 A1 | 6/2008 | Higaki et al. | |
| 2009/0146930 A1 | 6/2009 | Nishimura et al. | |
| 2011/0140120 A1 | 6/2011 | Higaki et al. | |

FOREIGN PATENT DOCUMENTS

| | | |
|---|---|---|
| JP | 2005-301162 | 10/2005 |
| JP | 2006-113571 | 4/2006 |
| JP | 2006-128666 | 5/2006 |
| JP | 2007-047808 | 2/2007 |
| JP | 2009-069735 | 4/2009 |
| JP | 2009-128577 | 6/2009 |
| JP | 2010-056025 | 3/2011 |
| WO | 2006/030937 | 3/2006 |

OTHER PUBLICATIONS

U.S. Appl. No. 13/281,841 to Arinobu Kanegae, which was filed on Oct. 26, 2011.

U.S. Appl. No. 13/281,691 to Arinobu Kanegae, which was filed on Oct. 26, 2011.

International Search Report in PCT/JP2010/005717, dated Oct. 26, 2010.

* cited by examiner

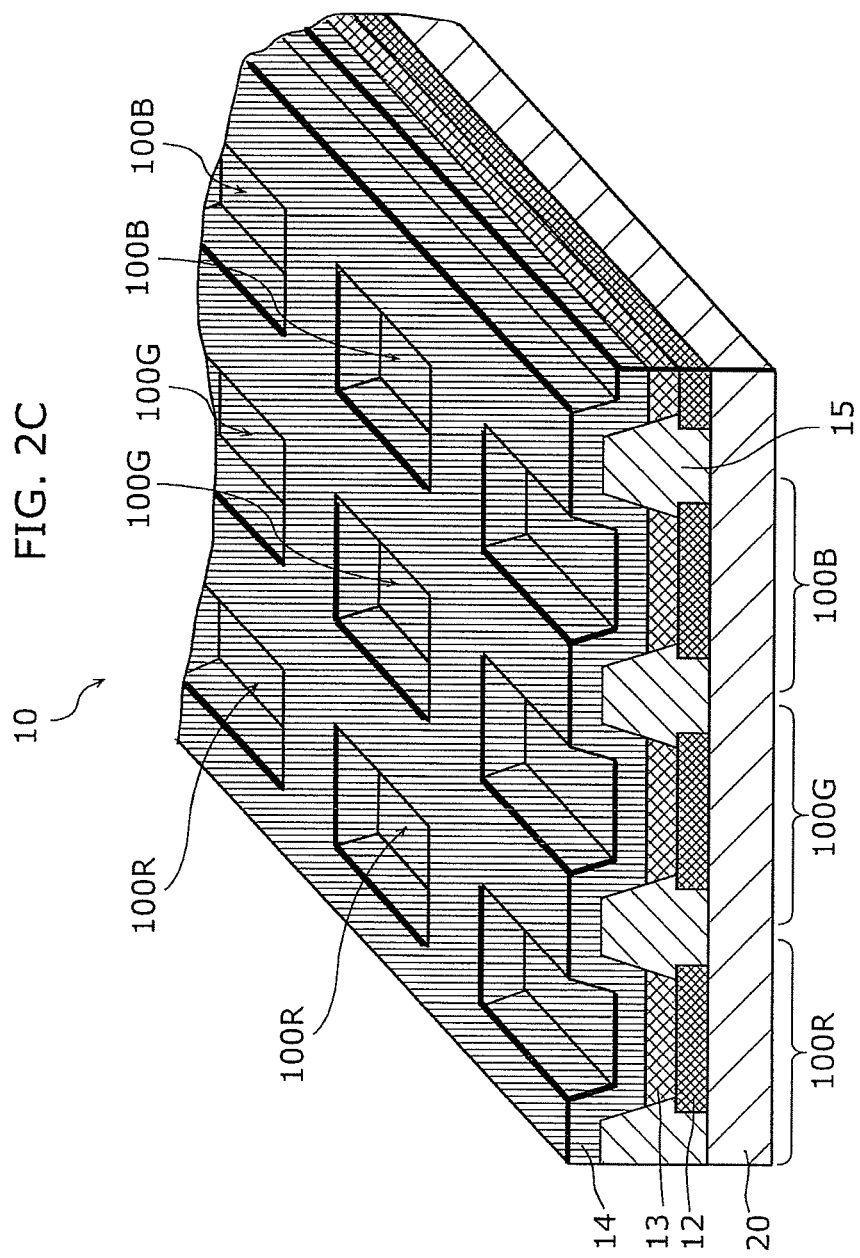

PRIOR ART

THIN-FILM TRANSISTOR ARRAY DEVICE, EL DISPLAY PANEL, EL DISPLAY DEVICE, THIN-FILM TRANSISTOR ARRAY DEVICE MANUFACTURING METHOD, EL DISPLAY PANEL MANUFACTURING METHOD

CROSS REFERENCE TO RELATED APPLICATION(S)

This is a continuation application of PCT Application No. PCT/JP2010/005717 filed on Sep. 21, 2010, designating the United States of America, the disclosure of which, including the specification, drawings and claims, is incorporated herein by reference in its entirety.

BACKGROUND OF THE INVENTION

1. Field of the Invention

The present invention relates to a thin-film transistor array device for an image display device formed by stacking, on a substrate, a thin film transistor having polycrystalline silicon or microcrystalline silicon as an active layer, to an electroluminescence (EL) display panel and an EL display which use the thin-film transistor array device.

2. Description of the Related Art

Thin-film transistors are used in drive substrates of display devices such as an organic electroluminescence (EL) display and a liquid crystal display and, at present, development towards high-performance is being actively pursued. In particular, amid demands for high current-driven performance in thin-film transistors following the increase in size and change to high-definition of displays, thin-film transistors that use a crystallized semiconductor thin-film (polycrystalline silicon or microcrystalline silicon) in an active layer have been gaining attention.

A low-temperature process using a processing temperature of 600° C. or lower is being developed as a crystallization process of semiconductor thin-films, in place of the already-established high-temperature process technology that uses a processing temperature of 1000° C. or higher. The low-temperature process does not require the use of expensive substrates such as heat-resistant quartz, and thus manufacturing cost can be reduced.

As part of the low-temperature process, laser annealing, which heats by using a laser beam, has been gaining attention. This pertains to irradiating a laser beam onto a non-single crystal semiconductor thin-film of amorphous silicon or polycrystalline silicon formed on a low-heat-resistance insulation substrate such as glass so as to melt the semiconductor thin-film by localized heating, and subsequently crystallizing the semiconductor thin-film in a cooling process thereof. A thin-film transistor is formed by stacking in which the crystallized semiconductor thin-film serves as an active layer (channel region). Since mobility of carriers increases, the crystallized semiconductor thin-film allows for increased performance of the thin-film transistor (For example, Patent Reference 1: Japanese Unexamined Patent Application Publication No. 07-235490).

Meanwhile, a bottom-gate structure in which the gate electrode is disposed below the semiconductor layer is the predominant thin-film transistor structure. A structure of a bottom-gate thin-film transistor 1000 shall be described with reference to FIG. 17 to FIG. 21.

As shown in FIG. 17 to FIG. 21, the thin-film transistor 1000 is a layered structure including a substrate 1010, a first metal layer 1020, a gate insulating film 1030, a semiconductor film 1040, a second metal layer 1050, and a passivation film 1060.

A gate wire 1021 and a gate electrode 1022 running from the gate wire 1021 are formed in the first metal layer 1020 that is stacked on of the substrate 1010. Furthermore, the gate insulating film 1030 is formed above the substrate 1010 and the first metal layer 1020 so as to cover the gate wire 1021 and the gate electrode 1022. In addition, the semiconductor film 1040 is stacked on the gate insulating film 1030 so as to overlap with the gate electrode 1022.

A source wire 1051, a source electrode 1052 running from the source wire 1051, and a drain electrode 1053 are formed in the second metal layer 1050 which is stacked above the gate insulating film 1030 and semiconductor film 1040. It should be noted that the source electrode 1052 and the drain electrode 1053 are disposed at opposing positions, and each overlaps with a part of the semiconductor film 1040. Furthermore, the passivation film 1060 is stacked on the gate insulating film 1030, the semiconductor film 1040, and the second metal layer 1050 so as to cover the source wire 1051, the source electrode 1052, and the drain electrode 1053.

In the bottom-gate thin-film transistor 1000 as described above, the gate wire 1021 and the gate electrode 1022 are formed in the first metal layer 1020 which is a lower layer than the semiconductor film 1040. In other words, the gate wire 1021 and the gate electrode 1022 are already formed during the laser crystallization process of the semiconductor film 1040. More specifically, the gate wire 1021 and the gate electrode 1022 need to have high heat resistance capable of resisting the temperature (approximately 600° C.) in the laser crystallization process.

SUMMARY OF THE INVENTION

However, with regard to metals which are typically used as an electrode material, conductivity tends to deteriorate with metals having higher heat-resistance. Therefore, when a material having high heat-resistance is used as the material for the gate electrode 1022, and the gate wire 1021 is formed from the same metal material in the same layer as the gate electrode 1022, the wire resistance of the gate wire 1021 becomes high. High wire resistance becomes a cause for signal delay, display unevenness due to a voltage drop, and so on. In particular, the impact of wire resistance increases when the panel area and the drive frequency increase.

Furthermore, as shown in FIG. 21, the gate wire 1021 formed in the first metal layer 1020 and the source wire 1051 formed in the second metal layer 1050 cross each other, with the approximately 200 nm-thick gate insulating film 1030 interposed in between. As such, when the thickness of the gate insulating film 1030 is to be reduced in order to increase the performance of the thin-film transistor 1000, the space between the gate wire 1021 and the source wire 1051 is further reduced, and thus there is the problem that parasitic capacitance between the wires increases.

In addition, the metal that is used in the electrodes and wires included in the thin-film transistor 1000 oxidizes due to contact with moisture in the air or oxide film, and the like, included in the thin-film transistor 1000, and thus there is the possibility of causing the performance of the thin-film transistor 1000 to deteriorate.

The present invention is conceived to solve the above-describe problems and has as an object to provide a thin-film transistor array device in which the gate electrode and the gate wire are formed using a material that is suitable to each one, and which reduces the parasitic capacitance between the gate wire and the source wire, and in addition, prevents metal oxidation.

A thin-film transistor array device according to an aspect of the present invention is stacked together with an EL layer including EL light-emitting elements each having a lower electrode, with an interlayer insulating film interposed in between. Specifically, the thin-film transistor array device includes: a substrate; a source wire disposed above the substrate; a gate wire crossing the source wire; a first transistor formed on the substrate and including a first gate electrode; a second transistor including a current-supply electrode for supplying current, the current-supply electrode being electrically connected to the lower electrode; a passivation film interposed between (i) the interlayer insulating film and (ii) the first transistor and the second transistor; and a conductive oxide film stacked on the passivation film. The current-supply electrode is electrically connected to the lower electrode via a first hole provided in the passivation film. The thin-film transistor array device further includes a relay electrode which is formed in a region on the passivation film and serves as a relay between the current-supply electrode and the lower electrode, the region overlapping with the current-supply electrode included in the second transistor. The first transistor and the second transistor are bottom gate transistors. The source wire is electrically connected to a source electrode of the first transistor and is disposed in a layer that is lower than the passivation film. The gate wire is (i) disposed on the passivation film which is a different layer from the first gate electrode included in the first transistor, and (ii) electrically connected to the first gate electrode via a second hole provided in the passivation film. An end of the source wire is exposed from an opening provided in the passivation film, and an exposed region of the end of the source wire serves as a terminal which is a connection with a source driving circuit outside the device. The conductive oxide film stacked on the passivation film covers the end of the source wire that is exposed from the opening. The conductive oxide film is interposed between (i) the passivation film and (ii) the gate wire and the relay electrode, and is not electrically connected between the gate wire and the relay electrode. The conductive oxide film is interposed between the relay electrode and the current-supply electrode, and electrically connects the relay electrode and the current-supply electrode. In addition, the relay electrode is formed in a same layer as the gate wire on the passivation film, and is made of a same material as the gate wire.

According to the present invention, it is possible to realize low resistance for the gate wire while maintaining the heat-resistance of the gate electrode. Furthermore, even when the thickness of the gate insulating film is reduced in order to improve thin-film transistor characteristics, parasitic capacitance between the gate wire and the source wire does not increase. In other words, it is possible to control image signal delays, and the like, caused by parasitic capacitance. In addition, by preventing oxidation of metal used in the respective electrodes and the respective wires, functional deterioration of the thin-film transistor array device can be prevented.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings:

FIG. 2C is a perspective view showing more specifically the stacked structure in FIG. 2A, and is a diagram showing an example of a pixel bank;

DESCRIPTION OF THE PREFERRED EMBODIMENT(S)

Figure 1:
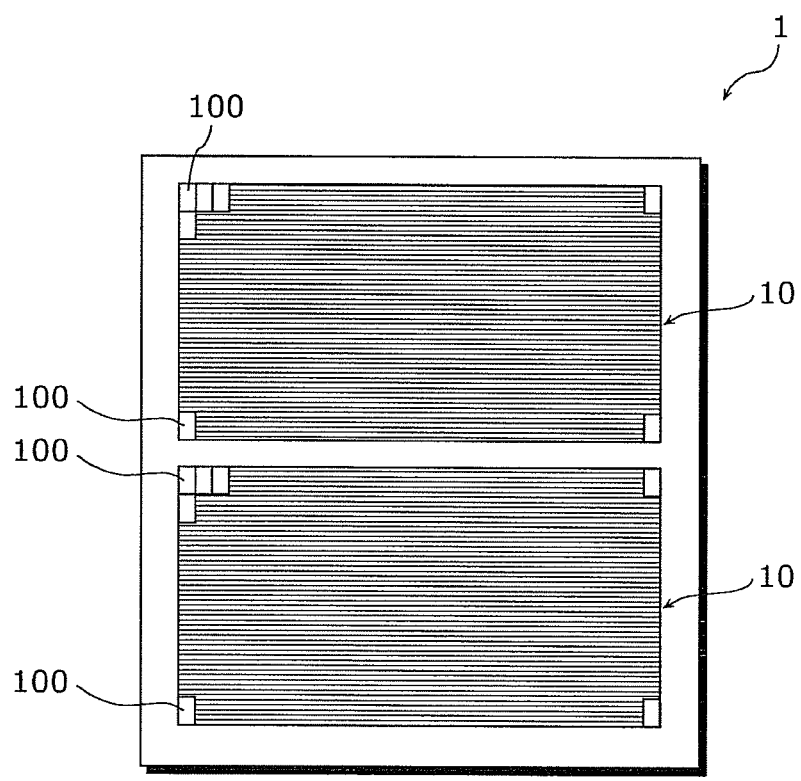
FIG. 1 is a diagram showing a thin-film semiconductor array substrate.

A thin-film transistor array device according to an aspect of the present invention is stacked together with an EL layer including EL light-emitting elements each having a lower electrode, with an interlayer insulating film interposed in between. Specifically, the thin-film transistor array device includes: a substrate; a source wire disposed above the substrate; a gate wire crossing the source wire; a first transistor formed on the substrate and including a first gate electrode; a second transistor including a current-supply electrode for supplying current, the current-supply electrode being electrically connected to the lower electrode; a passivation film interposed between (i) the interlayer insulating film and (ii) the first transistor and the second transistor; and a conductive oxide film stacked on the passivation film. The current-supply electrode is electrically connected to the lower electrode via a first hole provided in the passivation film. The thin-film transistor array device further includes a relay electrode which is formed in a region on the passivation film and serves as a relay between the current-supply electrode and the lower electrode, the region overlapping with the current-supply electrode included in the second transistor. The first transistor and the second transistor are bottom gate transistors. The source wire is electrically connected to a source electrode of the first transistor and is disposed in a layer that is lower than the passivation film. The gate wire is (i) disposed on the passivation film which is a different layer from the first gate electrode included in the first transistor, and (ii) electrically connected to the first gate electrode via a second hole provided in the passivation film. An end of the source wire is exposed from an opening provided in the passivation film, and an exposed region of the end of the source wire serves as a terminal which is a connection with a source driving circuit outside the device. The conductive oxide film stacked on the passivation film covers the end of the source wire that is exposed from the opening. The conductive oxide film is interposed between (i) the passivation film and (ii) the gate wire and the relay electrode, and is not electrically connected between the gate wire and the relay electrode. The conductive oxide film is interposed between the relay electrode and the current-supply electrode, and electrically connects the relay electrode and the current-supply electrode. In addition, the relay electrode is formed in a same layer as the gate wire on the passivation film, and is made of a same material as the gate wire.

In the above-described thin-film transistor array device, the source wire is disposed in a layer that is lower than the passivation film, and the gate wire is disposed on the passivation film which is a different layer from the gate electrode formed on the substrate. In addition, the gate electrode and the gate wire are electrically connected via a hole provided in the passivation film. As such, the space between the gate wire and the source wire corresponds to the thickness of the passivation film formed on the source electrode, and not to the space between the gate electrode and the source electrode. Here, since the passivation film protects the surface of the thin-film transistor array device, increasing the thickness of the passivation film does not affect the performance of the thin-film transistor device. As a result, by adjusting the thickness of the passivation film to ensure a distance between the gate wire and the source wire, parasitic capacitance between the gate wire and the source wire can be reduced.

Furthermore, an end of the source wire can be exposed from an opening provided in the passivation film, and an exposed region of the end of the source wire can be used as a terminal which is a connection with a source driving circuit outside the device. In this case, the exposed region of the end of the source wire comes into contact with air or moisture in air and easily becomes oxidized. When oxidized, the oxidized terminal and the outside driver circuit become electrically connected via an oxidized layer having high electrical resistance, and thus there is the problem that the connection resistance between the terminal and the outside driver circuit becomes high.

Thus, in the thin-film transistor array device having the above-described configuration, the conductive oxide film is stacked on the passivation film, and the region of the end of the source wire that is exposed via the opening in the passivation film is covered by the conductive oxide film. With this, the conductive oxide film can prevent the oxidation of the terminal which is the end of the source wire, that is, the exposed region of the end of the source wire. As a result, the terminal and the outside driver circuit can be connected with low resistance for the connection resistance between the terminal and the outside driver circuit.

As describe above, when the conductive oxide film (Indium Tin Oxide: ITO) is stacked on the passivation film, the conductive oxide film becomes interposed between the current-supply electrode included in the second transistor and the lower electrode which is primarily composed of aluminum, and thus the problem of the lower electrode oxidizing due to the conductive oxide film arises. In response to this, according to the above described configuration, a relay electrode is formed at a region, on the passivation film, which overlaps with the current-supplying electrode (meaning "the source electrode or the drain electrode"; the same applies hereafter) included in the second transistor, and the relay electrode is made to act as a relay between the current-supply electrode and the lower electrode. Furthermore, the conductive oxide film is interposed between the passivation film and the relay electrode. The conductive oxide film is interposed between the relay electrode and the current-supply electrode. With this, the relay electrode is present between the lower electrode and the conductive oxide film, and thus the conductive oxide film can prevent the lower electrode from oxidizing.

In addition, the relay electrode is formed in the same layer as the gate wire on the passivation film, and is made of the same material as the gate wire. In this manner, by disposing the gate wire on the passivation film, the relay electrode can be formed in the same layer as the gate wire, and using the same material as the gate wire. As such, the formation of the gate wire and the formation of the relay electrode can be performed in the same process. As a result, a simple configuration allows the conductive oxide film to prevent the lower electrode from oxidizing, while the parasitic capacitance between the gate wire and the source wire is reduced.

Furthermore, the lower electrode may be a metal primarily composed of aluminum. Since the relay electrode is present between the lower electrode and the conductive oxide film, the conductive oxide film can prevent the lower electrode from oxidizing, via the relay electrode, even when a metal primarily composed of aluminum is used for the lower electrode.

Furthermore, a surface of the gate wire and the relay electrode that is in contact with the conductive oxide film may be formed from a metal that includes at least one of copper, molybdenum, titanium, and tungsten.

Furthermore, the gate wire and the relay electrode may have a layered structure.

Furthermore, the interlayer insulating film may include two layers including an organic film and an inorganic film. In addition, the inorganic film may cover the gate wire and the relay electrode.

Furthermore, a semiconductor layer included in each of the first transistor and the second transistor may be a crystalline semiconductor layer. In addition, the first gate electrode included in the first transistor and a second gate electrode included in the second transistor may be made of a metal having higher heat-resistance than a metal used for the gate wire.

According to the above-described configuration, a semiconductor layer included in each of the first transistor and the second transistor may be a crystalline semiconductor layer. In this case, in order to form the semiconductor layer as a crystalline semiconductor layer, it is necessary to crystallize the amorphous semiconductor layer by raising the temperature of the amorphous semiconductor layer to within a range of between 1100° C. and 1414° C., inclusive, by irradiating a laser onto the amorphous semiconductor layer. In the bottom-gate thin-film transistor array device, first, the gate electrode is formed on the substrate, after which the semiconductor layer is formed. Therefore, when the amorphous semiconductor layer is to be crystallized using such a high-heat processing as described above, the heat-resistance of the metal making up the gate electrode needs to be high. Meanwhile, since a metal having high heat-resistance also has high resistance, forming the gate electrode and the gate wire using the same material means that the gate wire is also formed from a metal having high resistance, and thus there is the problem that the resistance of the gate wire becomes high.

However, according to the thin-film transistor array device having the above-described configuration, forming the gate electrode and the gate wire in different layers allows for the selection of different materials for the gate electrode and the gate wire. With this, it is possible to lower the resistance of the gate wire by selecting a low-resistance metal for the metal making up the gate wire, while increasing the heat-resistance of the metal making up the gate electrode.

Furthermore, the metal having higher heat-resistance than the metal used for the gate wire may be a metal which includes one of molybdenum, tungsten, titanium, tantalum, and nickel.

Furthermore, the conductive oxide film may be one of an oxide film including indium and tin and an oxide film including indium and zinc.

As one aspect, an end of the gate wire may be connected, via the conductive oxide film, to one end of a relay wire formed on a gate insulating film. Furthermore, the other end of the relay wire may be exposed from an opening provided in the passivation film, and an exposed region of the other end of the relay wire may serve as a terminal which is a connection with a gate driving circuit outside the device. Moreover, the conductive oxide film stacked on the passivation film may cover the other end of the relay wire that is exposed from the opening.

In addition, the relay wire may be disposed in a same layer and made of a same material as the source wire.

As another aspect, at an end of the gate wire, the conductive oxide layer formed below the gate wire may extend beyond the gate wire so as to be exposed. In addition, an exposed region of the conductive oxide layer may serve as a terminal which is a connection with a gate driving circuit outside the device.

Furthermore, an elastic body may be formed at a position, on a gate insulating film, which overlaps with at least the region serving as the terminal out of the exposed region of the conductive oxide film.

In addition, the elastic body may be disposed in a same layer and made of a same material as the source wire.

An electroluminescence (EL) display panel according to an aspect of the present invention includes: an upper electrode; a lower electrode; an EL unit which includes an EL light-emitting element including a light-emitting function layer interposed between the upper electrode and the lower electrode; a thin-film transistor array device which controls the EL light-emitting element; and an interlayer insulating film interposed between the EL unit and the thin-film transistor array device, wherein the lower electrode is electrically connected to the thin-film transistor array device via a contact hole in the interlayer insulating film. The thin-film transistor array device includes: a substrate; a source wire disposed above the substrate; a gate wire crossing the source wire; a first transistor formed on the substrate and including a first gate electrode; a second transistor including a current-supply electrode for supplying current, the current-supply electrode being electrically connected to the lower electrode; a passivation film interposed between (i) the interlayer insulating film and (ii) the first transistor and the second transistor; and a conductive oxide film stacked on the passivation film. The current-supply electrode is electrically connected to the lower electrode via a first hole provided in the passivation film and a contact hole provided in the interlayer insulating film. The thin-film transistor array device further includes a relay electrode which is formed in a region on the passivation film and serves as a relay between the current-supply electrode and the lower electrode, the region overlapping with the current-supply electrode included in the second transistor. The first transistor and the second transistor are bottom gate transistors. The source wire is electrically connected to a source electrode of the first transistor and is disposed in a layer that is lower than the passivation film. The gate wire is (i) disposed on the passivation film which is a different layer from the first gate electrode included in the first transistor, and (ii) electrically connected to the first gate electrode via a second hole provided in the passivation film. An end of the source wire is exposed from an opening provided in the passivation film, and an exposed region of the end of the source wire serves as a terminal which is a connection with a source driving circuit outside the device. The conductive oxide film stacked on the passivation film covers the end of the source wire that is exposed from the opening. The conductive oxide film is interposed between (i) the passivation film and (ii) the gate wire and the relay electrode, and is not electrically connected between the gate wire and the relay electrode. The conductive oxide film is interposed between the relay electrode and the current-supply electrode, and electrically connects the relay electrode and the current-supply electrode. In addition, the relay electrode is formed in a same layer as the gate wire on the passivation film, and is made of a same material as the gate wire.

In an EL display panel, the margin for driving the display panel decreases as the size of the display panel increases to 20 inches, 30 inches, 40 inches, and so on, because of the delay in gate signals caused by the thin-film transistor array device which controls the light-emission of the EL element unit of the display panel.

Under these circumstances, using the thin-film transistor array device having the above-described configuration allows for the reduction of the parasitic capacitance between the source wire and the gate wire even in a large-screen EL display panel, and thus making it possible to realize an EL display device which can display images with high picture quality, without gate signal delay, dulling of gate signal waveform, and image signal deterioration. Furthermore, since the electrical connection between the thin-film transistor array device and the EL element has low resistance, it is possible to realize an EL panel having a long operating life and high light-emission luminance with low power consumption without reducing the light-emission current of the EL element. In addition, since a simple configuration allows the conductive oxide film to prevent the lower electrode from oxidizing, while the parasitic capacitance between the gate wire and the source wire is reduced, it is possible to realize an EL display panel having a high manufacturing yield.

Furthermore, the lower electrode may be a metal primarily composed of aluminum.

Furthermore, the lower electrode and the relay electrode may be connected at a flat region running along a circumference of an upper part of a hole provided in the passivation film.

The EL display device according to an aspect of the present invention includes the above-described EL display panel.

A method of manufacturing a thin-film transistor array device according to an aspect of the present invention includes: preparing a substrate; forming a source wire above the substrate; forming a first transistor including a first gate electrode, on the substrate; forming, on the substrate, a second transistor including a current-supply electrode for supplying current; forming a passivation film above the first transistor and the second transistor; stacking a conductive oxide film on the passivation film; and forming, above the source wire, a gate wire that crosses the source wire and forming a relay electrode in a region, on the passivation film, which overlaps with the current-supply electrode included in the second transistor, the relay electrode serving as a relay between the current-supply electrode and the lower electrode. The first transistor and the second transistor are bottom gate transistors. The source wire is electrically connected to a source electrode of the first transistor and is disposed in a layer that is lower than the passivation film. The gate wire is (i) disposed on the passivation film which is a different layer from the first gate electrode included in the first transistor, and (ii) electrically connected to the first gate electrode via a hole provided in the passivation film. In between the forming of a passivation film and the stacking, an end of the source wire is exposed from an opening provided in the passivation film, and an exposed region of the end of the source wire is formed into a terminal which is a connection with a source driving circuit outside the device. In the stacking, the conductive oxide film to be stacked on the passivation film is formed so as to cover the end of the source wire that is exposed from the opening. The conductive oxide film is formed between (i) the passivation film and (ii) the gate wire and the relay electrode, and is divided in between the gate wire and the relay electrode. The conductive oxide film is interposed between the relay electrode and the current-supply electrode, and electrically connects the relay electrode and the current-supply electrode. In addition, in the forming of a relay electrode, the relay electrode is formed in a same layer as the gate wire on the passivation film, using a same material as the gate wire.

The conductive oxide film not only covers the vicinity of the exposed region of the end of the source wire but also interposes between the passivation film and the gate wire and relay electrode. In other words, in the stacking of the conductive oxide film on the passivation film, the conductive oxide film is not stacked in the vicinity of the exposed region of the end of the source wire only but all over on the passivation film. Next, the metal film which will become the gate wire and the relay wire is stacked all over on the conductive oxide film. Next, a predetermined patterning mask is disposed on the metal film, and the gate wire is patterned out using a predetermined etchant. Since the gate wire and the conductive oxide film are etched using a half-tone process, the conductive oxide film remains below the gate wire. Lastly, the predetermined patterning mask is peeled off.

As such, the conductive oxide film remains in the layer below the gate wire. In contrast, there is also a method of etching the conductive oxide film before the metal film which is to become the gate wire and the relay electrode is stacked on the conductive oxide film, and then patterning the metal film which is to become the gate wire and the relay electrode. However, in this case, two patterning processes are required, and thus process cost increases. On the other hand, by stacking the metal film which is to become the gate wire and the relay electrode all over on the conductive oxide film, and subsequently etching the metal film and conductive oxide film using a half-tone mask as in the this aspect, the number of patterning processes is reduced to one, and thus allowing process cost to be reduced.

Furthermore, the lower electrode may be a metal primarily composed of aluminum.

Furthermore, a surface of the gate wire and the relay electrode that is in contact with the conductive oxide film may be made of a metal that includes at least one of copper, molybdenum, titanium, and tungsten.

Furthermore, a semiconductor layer included in each of the first transistor and the second transistor may be a crystalline semiconductor layer.

In addition, the first gate electrode included in the first transistor and a second gate electrode included in the second transistor may be made of a metal having higher heat-resistance than a metal used for the gate wire.

According to the above-described manufacturing method, forming the gate electrode and the gate wire in different layers allows for the selection of different materials for the gate electrode and the gate wire. With this, it is possible to lower the resistance of the gate wire by selecting a low-resistance metal for the metal making up the gate wire, while increasing the heat-resistance of the metal making up the gate electrode. As a result, it becomes possible to form a semiconductor layer having high mobility, and a gate wire having low resistance can be formed.

Furthermore, the conductive oxide film may be one of an oxide film including indium and tin and an oxide film including indium and zinc A method of manufacturing an electroluminescence (EL) panel according to an aspect of the present invention includes: preparing a substrate; forming a source wire above the substrate; forming a first transistor including a first gate electrode, on the substrate; forming, on the substrate, a second transistor including a current-supply electrode for supplying current; forming a passivation film above the first transistor and the second transistor; stacking a conductive oxide film on the passivation film; forming, above the source wire, a gate wire that crosses the source wire, and forming a relay electrode in a region, on the passivation film, which overlaps with the current-supply electrode included in the second transistor, the relay electrode serving as a relay between the current-supply electrode and the lower electrode; forming an interlayer insulating film above the passivation film; forming a lower electrode on the interlayer insulating film forming a light-emitting function layer above the lower electrode; and forming an upper electrode above the light-emitting function layer. The first transistor and the second transistor are bottom gate transistors. The source wire is electrically connected to a source electrode of the first transistor and is disposed in a layer that is lower than the passivation film. The gate wire is (i) disposed on the passivation film which is a different layer from the first gate electrode included in the first transistor, and (ii) electrically connected to the first gate electrode via a first hole provided in the passivation film. The lower electrode is electrically connected to a thin-film transistor array device via a second hole provided in the passivation film and a contact hole in the interlayer insulating film. In between the forming of a passivation film and the stacking, an end of the source wire is exposed from an opening provided in the passivation film, and an exposed region of the end of the source wire is formed into a terminal which is a connection with a source driving circuit outside the device. In the stacking, the conductive oxide film to be stacked on the passivation film is formed so as to cover the end of the source wire that is exposed from the opening. The conductive oxide film is formed between (i) the passivation film and (ii) the gate wire and the relay electrode, and is divided in between the gate wire and the relay electrode. The conductive oxide film is interposed between the relay electrode and the current-supply electrode, and electrically connects the relay electrode and the current-supply electrode. In addition, in the forming of a relay electrode, the relay electrode is formed in a same layer as the gate wire on the passivation film, using a same material as the gate wire.

Hereinafter, an embodiment of the present invention shall be described in detail with reference to the Drawings.

Embodiment

Figure 2A:
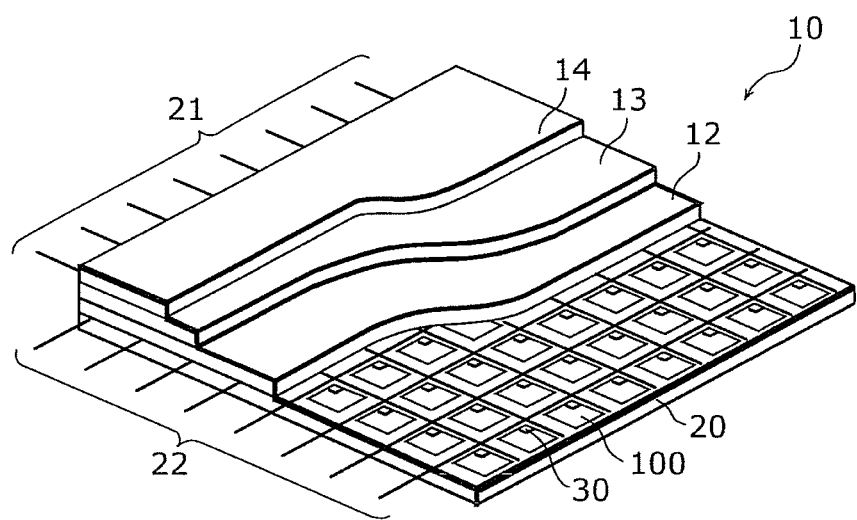
FIG. 2A is a perspective view of an organic EL display according to an embodiment.
Figure 2B:
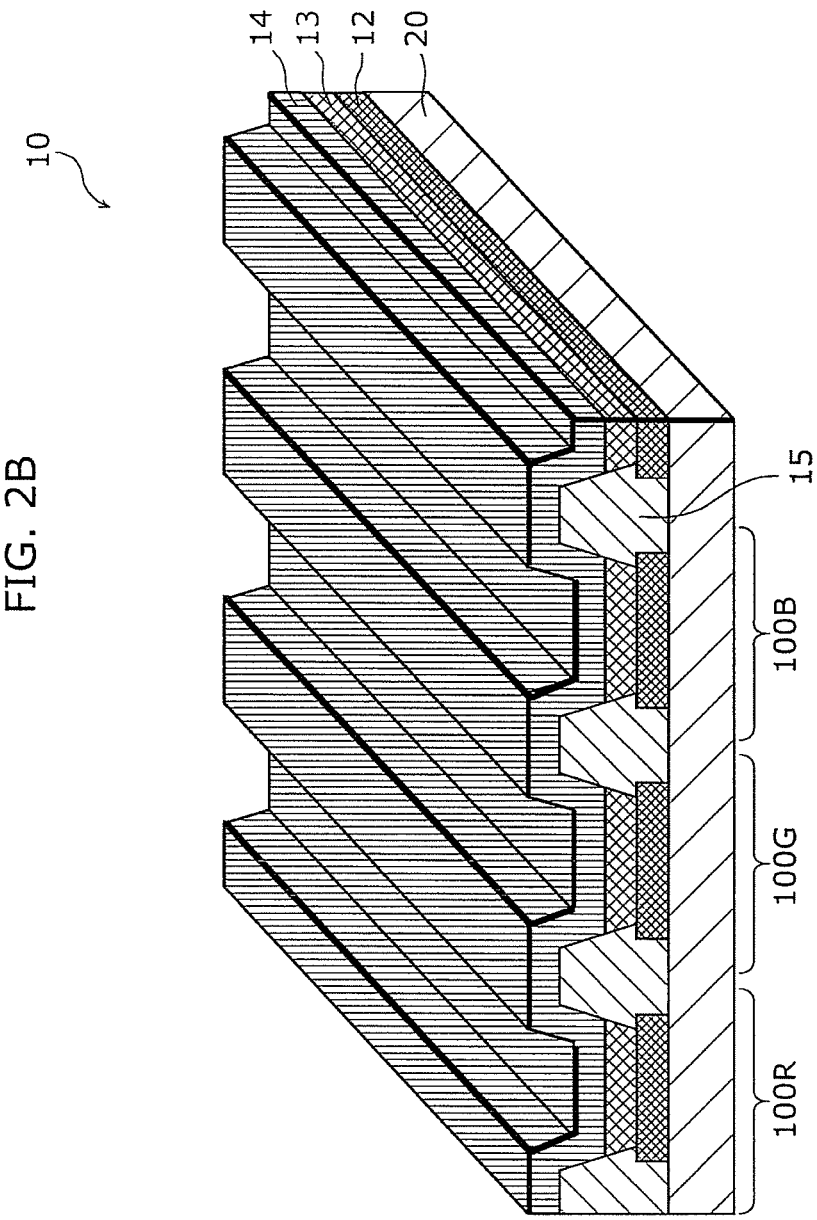
FIG. 2B is a perspective view showing more specifically the stacked structure in FIG. 2A, and is a diagram showing an example of a line bank.
Figure 3:
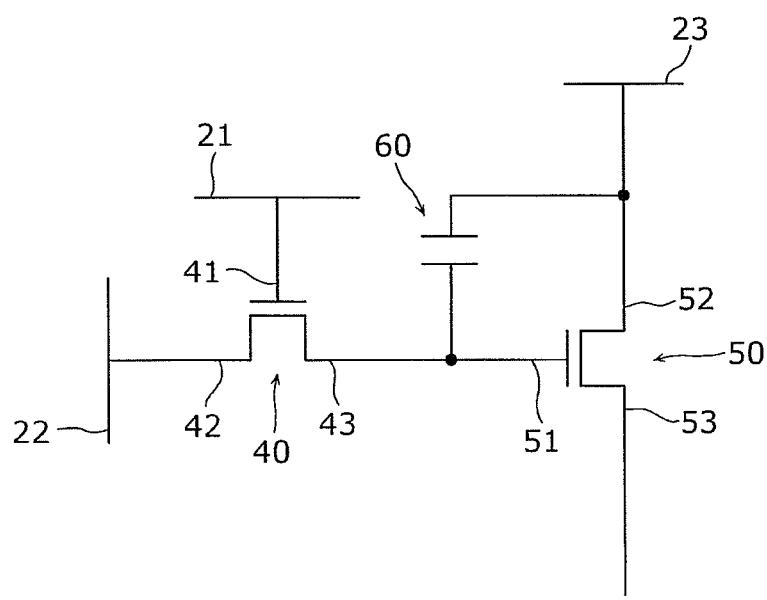
FIG. 3 is a diagram showing a circuit configuration of a pixel circuit.

An organic electroluminescence (EL) display (organic EL display device) 10 and a thin-film transistor array device for use in an image display device (hereinafter denoted simply as "thin-film transistor array device") 20 shall be described with reference to FIG. 1 to FIG. 3. It should be noted that FIG. 1 is a diagram showing a thin-film semiconductor array substrate 1. FIG. 2A is a perspective view of the organic EL display 10 which is an example of a display device according to the embodiment of the present invention. FIG. 2B is a perspective view showing more specifically the stacked structure in FIG. 2A, and is a diagram showing an example of a line bank. FIG. 2C is a perspective view showing more specifically the stacked structure in FIG. 2A, and is a diagram showing an example of a pixel bank. FIG. 3 is a diagram showing a circuit configuration of a pixel circuit 30 which drives a pixel 100.

First, as shown in FIG. 1, the thin-film semiconductor array substrate 1 includes plural (2 in FIG. 1) organic EL displays 10. Furthermore, as shown in FIG. 2A, each of the organic EL displays 10 is a stacked structure of, from the lowest layer, the thin-film transistor array device 20, an interlayer insulating film (planarizing film) 11 (not illustrated in FIG. 2A), an anode (lower electrode) 12, an organic EL layer (organic light-emitting layer) 13, and a transparent cathode (upper electrode) 14. Furthermore, a hole transport layer (not illustrated) is stacked between the anode 12 and the organic EL layer 13, and an electron transport layer (not illustrated) is stacked between the organic EL layer 13 and the transparent cathode 14.

The pixels 100 are arranged in rows and columns (a matrix) in the thin-film transistor array device 20. Each of the pixels 100 is driven by the pixel circuit 30 that is provided thereto. Furthermore, the thin-film transistor array device 20 includes: plural gate wires 21 which are arranged in rows; plural source wires (signal wires) 22 which are arranged in columns so as to cross the gate wires 21; and plural power wires 23 (not illustrated in FIG. 2A) which run parallel to the source wires 22.

For each row, one of the gate wires 21 is connected to respective gate electrodes 41 (not illustrated in FIG. 2A) of thin-film transistors each of which operates as a switching element included in the respective pixel circuits 30 in that row. For each column, one of the source wires 22 is connected to respective source electrodes 42 (not illustrated in FIG. 2A) of the thin-film transistors each of which operates as a switching element included in the respective pixel circuits 30 in that column. For each column, one of the power wires 23 is connected to respective drain electrodes 52 (not illustrated in FIG. 2A) of the thin-film transistors each of which operates as a switching element included in the respective pixel circuits 30 in that column.

More specifically, as shown in FIG. 2B and FIG. 2C, each of the pixels 100 of the organic EL display 10 includes subpixels 100R, 100G, and 100B of three colors (red color, green color, and blue color). Plural subpixels 100R, subpixels 100G, and subpixels 100B are respectively lined up in the depth direction in FIG. 2B (this is denoted as a "subpixel column").

FIG. 2B is a diagram showing an example of a line bank, and the respective subpixel columns are separated from each other by banks 15. Each of the banks 15 shown in FIG. 2B is a protrusion running in a parallel direction to the source wires 22, between adjacent subpixel columns, and is formed on the thin-film transistor array device 20. Stated differently, each of the subpixel columns is formed in between adjacent protrusions (that is, in the openings formed by the banks 15).

The anode 12 is formed, for each of the subpixels 100R, 100G, and 100B, on the thin-film transistor array device 20 (more specifically, on the interlayer insulating film 11), inside the openings formed by the banks 15.

The organic EL layer 13 is formed on the anodes 12 and inside the openings formed by the banks 15, for each subpixel column (that is, so as to cover the anodes 12 in each of the columns). The transparent cathode 14 is formed continuously on the organic EL layers 13 and the banks 15 (protrusions) so as to cover all of the subpixels 100R, 100G, and 100B.

On the other hand, FIG. 2C is a diagram showing an example of a pixel bank, and shows the respective subpixels 100R, 100G, and 100B being separated from each other by the banks 15. The banks 15 shown in FIG. 2C are formed such that protrusions running parallel to the gate wires 21 and protrusions running parallel to the source wires 22 cross each other. In addition, the subpixels 100R, 100G, and 100B are formed in the parts surrounded by these protrusions (that is, in the openings formed by the banks 15).

The anode 12 is formed, for each of the subpixels 100R, 100G, and 100B, on the thin-film transistor array device 20 (more specifically, on the interlayer insulating film 11), inside the openings formed by the banks 15. In the same manner, the organic EL layer 13 is formed on the anodes 12 and inside the openings formed by the banks 15, for each subpixel column. The transparent cathode 14 is formed continuously on the organic EL layers 13 and the banks 15 (protrusions) so as to cover all of the subpixels 100R, 100G, and 100B.

Figure 7:
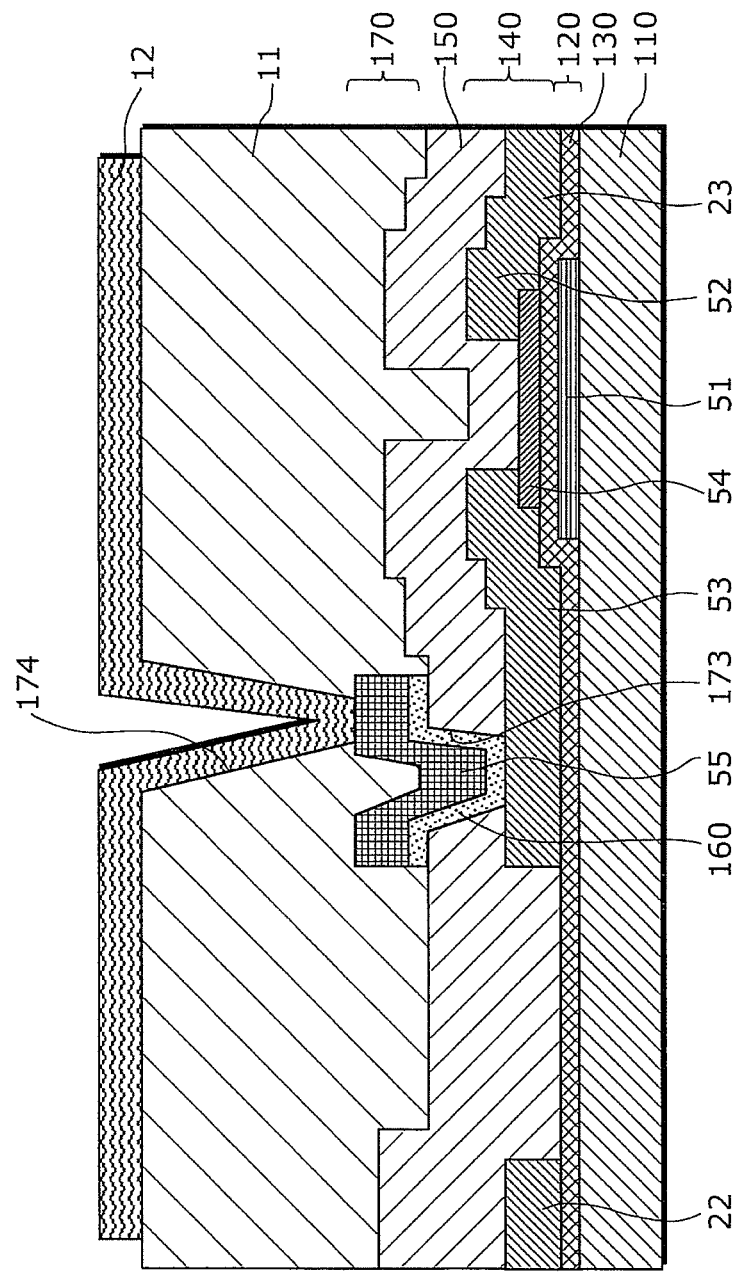
FIG. 7 is a cross-sectional view along VII-VII in FIG. 4.

In addition, although not illustrated in FIG. 2B and FIG. 2C, the pixel circuit 30 is formed, for each of the subpixels 100R, 100G, and 100B, in the thin-film transistor array device 20. In addition, as shown in FIG. 7, each of the subpixels 100R, 100G, and 100B are electrically connected to the corresponding pixel circuit 30 via a third contact hole 173, a fourth contact hole 174, and a relay electrode 55, respectively.

It should be noted that, except for the difference in the characteristics (color of emitted light) of the organic EL layers 13, the subpixels 100R, 100G, and 100B have the same configuration. With that, in the subsequent description, the subpixels 100R, 100G, and 100B shall not be differentiated and all will be denoted as the "pixel 100". Furthermore, the present invention can be applied in the same manner in the line bank shown in FIG. 2B and in the pixel bank shown in FIG. 2C.

As shown in FIG. 3, the pixel circuit 30 includes a first transistor 40 which operates as a switch element; a second transistor 50 which operates as a drive element; and a capacitor 60 which stores data to be displayed in the corresponding pixel.

The first transistor 40 includes: a gate electrode 41 connected to the gate wire 21; a source electrode 42 connected to the source wire 22; a drain electrode 43 connected to the capacitor 60 and the gate electrode 51 of the transistor 50; and a semiconductor film 44 (not illustrated in FIG. 3). When voltage is applied to the gate wire 21 and the source wire 22 to which the first transistor 40 is connected, the first transistor 40 stores the voltage value applied to the source wire 22, as display data, in the capacitor 60.

The second transistor 50 includes: the gate electrode 51 connected to the drain 43 of the first transistor 40; a drain electrode 52 connected to the power wire 23 and the capacitor 60; a source electrode 53 connected to the anode 12; and a semiconductor film 54 (not illustrated in FIG. 3). The second transistor 50 supplies a current corresponding to the voltage value held by the capacitor 60, from the power wire 23 to the anode 12, through the source electrode 53.

Specifically, the organic EL display 10 having the above-described configuration adopts the active matrix method in which display control is performed for each pixel 100 located at respective crosspoints of the gate wires 21 and source wires 22.

Figure 4:
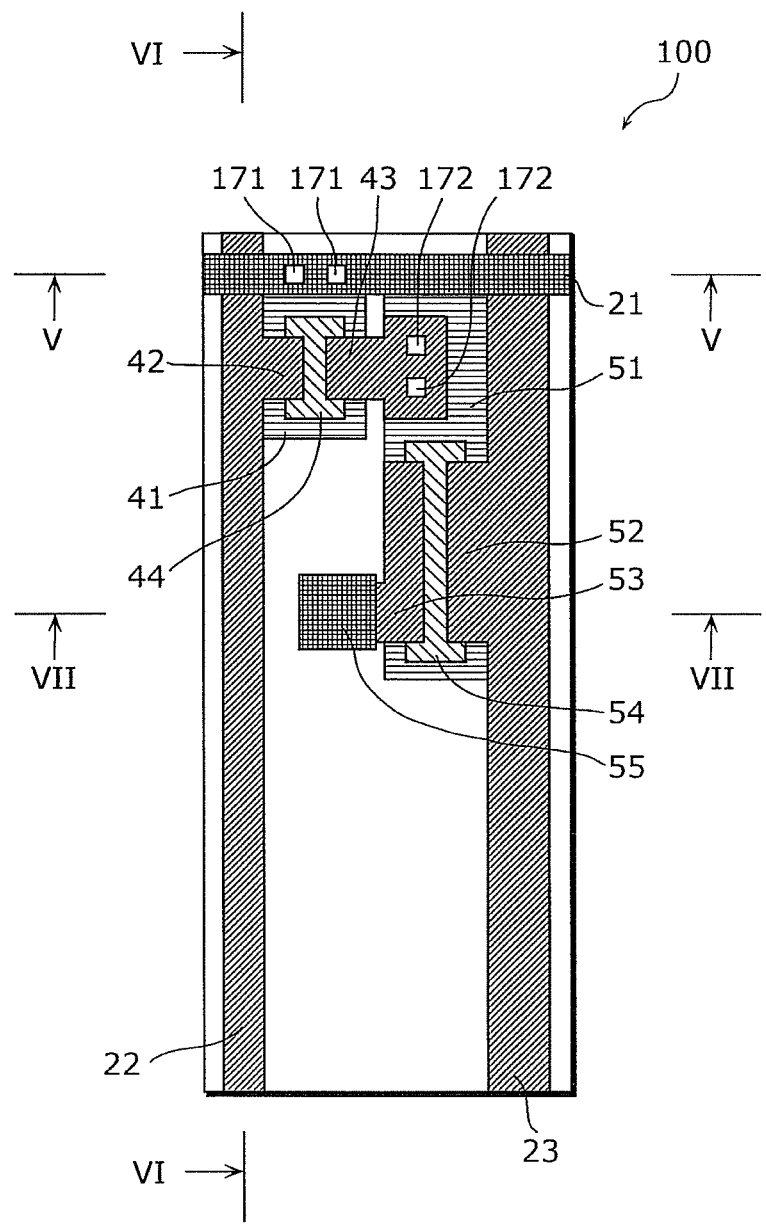
FIG. 4 is a front view showing a configuration of a pixel.
Figure 5:
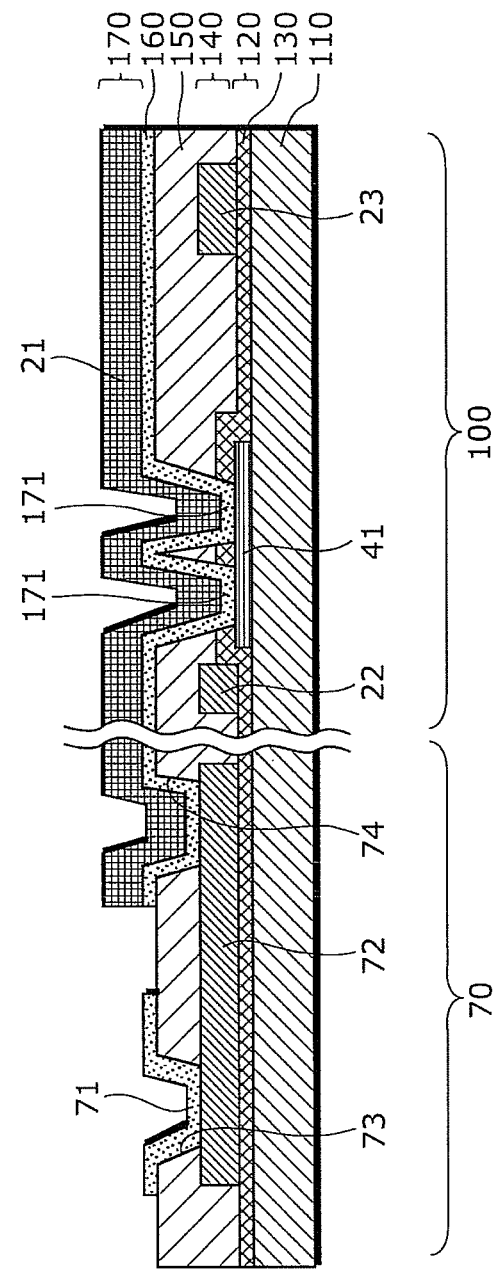
FIG. 5 is a cross-sectional view along V-V in FIG. 4.
Figure 6:
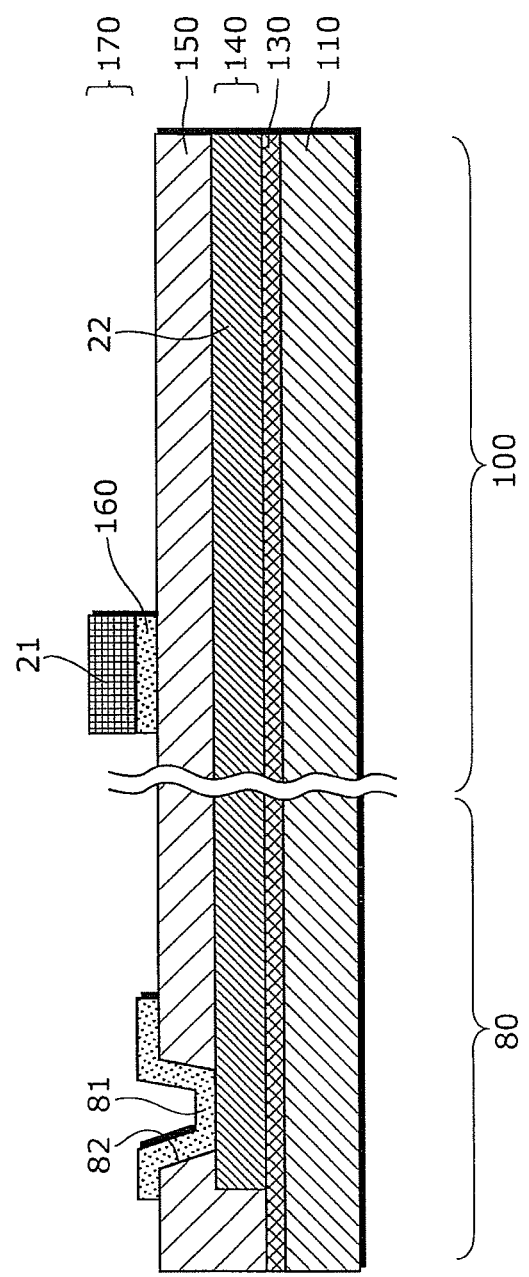
FIG. 6 is a cross-sectional view along VI-VI in FIG. 4.
Figure 8:
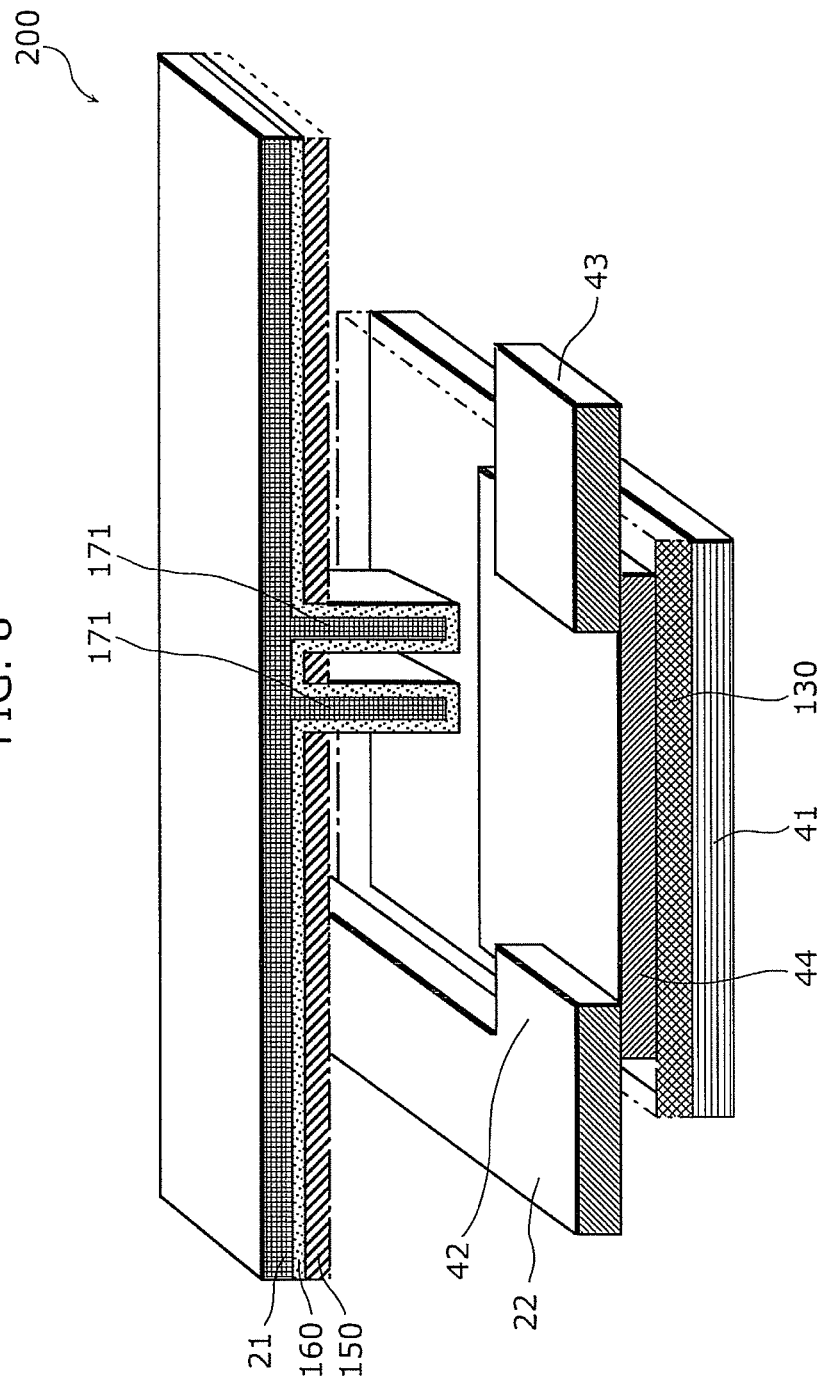
FIG. 8 is a perspective view of main parts as seen from the cross-section along V-V in FIG. 4.

Next, the structure (the structure to the right of the break lines in FIG. 5 and FIG. 6) of the pixels 100 included in the thin-film transistor array device 20 shall be described with reference to FIG. 4 to FIG. 8. It should be noted that FIG. 4 is a front view showing the configuration of a pixel 100. FIG. 5 is a cross-sectional view along V-V in FIG. 4. FIG. 6 is a cross-sectional view along VI-VI in FIG. 4. FIG. 7 is a cross-sectional view along VII-VII in FIG. 4. FIG. 8 is a perspective view of main parts as seen from the cross-section along V-V in FIG. 4. It should be noted that the interlayer insulating film 11 and the anode 12 are also illustrated in FIG. 7.

As shown in FIG. 4 to FIG. 7, the pixel 100 is a stacked structure including a substrate 110, a first metal layer (conductive layer) 120, a gate insulating film 130, the semiconductor films 44 and 54, a second metal layer (conductive layer) 140, a passivation film 150, a conductive oxide film (Indium Tin Oxide: ITO) 160, and a third metal layer (conductive layer) 170.

The gate electrode 41 of the first transistor 40 and the gate electrode 51 of the second transistor 50 are formed in the first metal layer 120 which is stacked on the substrate 110. Furthermore, the gate insulating film 130 is formed on the substrate 110 and the first metal layer 120 so as to cover the gate electrodes 41 and 51.

The semiconductor film 44 is disposed inside a region which is on the gate insulating film 130 (between the gate insulating film 130 and the second metal layer 140) and overlaps with the gate electrode 41. In the same manner, the semiconductor film 54 is disposed inside a region which is on the gate insulating film 130 (between the gate insulating film 130 and the second metal layer 140) and overlaps with the gate electrode 51. It should be noted that "overlaps" in the present Specification refers to a positional relationship in which one lies on top of the other as seen from the vertical direction.

The source wire 22, the power wire 23, the source electrode 42 and the drain electrode 43 of the first transistor 40, and the drain electrode 52 and the source electrode 53 of the second transistor 50 are formed in the second metal layer 140 which is stacked on the gate insulating film 130 and the semiconductor films 44 and 54. Specifically, the first transistor 40 and the second transistor 50 are bottom-gate transistors in which the gate electrodes 41 and 51 are formed in a layer lower than that of the source electrodes 42 and 53 and the drain electrodes 43 and 52, respectively.

More specifically, the source electrode 42 and the drain electrode 43 are formed at opposing positions, and each overlaps with a part of the semiconductor film 44. Furthermore, the source electrode 42 runs from the source wire 22 formed in the same layer. In the same manner, the drain electrode 52 and the source electrode 53 are formed at opposing positions, and each overlaps with a part of the semiconductor film 54. Furthermore, the drain electrode 52 runs from the power wire 23 formed in the same layer.

Furthermore, second contact holes (holes) 172 are formed in the gate insulating film 130, penetrating in the thickness direction at positions that overlap with the drain electrode 43 and the gate electrode 51. In addition, the drain electrode 43 is electrically connected to the gate electrode 51 formed in the first metal layer 120, via the second contact holes 172.

Furthermore, the passivation film 150 is formed on the gate insulating film 130 and the second metal layer 140 so as to cover the source electrodes 42 and 53 and the drain electrodes 43 and 52. In other words, the passivation film 150 is formed to interpose between (i) the interlayer insulating film 11 and (ii) the first transistor 40 and second transistor 50.

The conductive oxide film 160 is stacked on the passivation film 150. In addition, the third metal layer 170 is stacked on the conductive oxide film 160. The gate wire 21 and the relay electrode 55 are formed in the third metal layer 170 which is stacked on the conductive oxide film 160. The conductive oxide film 160 is selectively formed at positions overlapping with the gate wire 21 and the relay electrode 55, and the part of the conductive oxide film 160 that overlaps with the gate wire 21 and the part of the conductive oxide film 160 that overlaps with the relay electrode 55 are not electrically connected.

Furthermore, first contact holes (holes) 171 are formed in the gate insulating film 130 and the passivation film 150, penetrating in the thickness direction at positions that overlap with the gate wire 21 and the gate electrode 41. In addition, the gate wire 21 is electrically connected to the gate electrode 41 formed in the first metal layer 120, via the first contact holes 171. It should be noted that the gate wire 21 and the gate electrode 41 are not in direct contact, and that the conductive oxide film 160 is interposed in between.

In the same manner, a third contact hole (hole) 173 is formed in the passivation film 150, penetrating in the thickness direction at a position that overlaps with the source electrode 53 of the second transistor 50 and the relay electrode 55. In addition, the relay electrode 55 is electrically connected to the source electrode 53 formed in the second metal layer 140, via the third contact hole 173. It should be noted that the source electrode 53 and the relay electrode 55 are not in direct contact, and that the conductive oxide film 160 is interposed in between.

In addition, the interlayer insulating film 11 is formed on the passivation film 150 and the third metal layer 170 so as to cover the gate wire 21 and the relay electrode 55. The banks 15 are formed on the interlayer insulating film 11 in the boundaries with the adjacent pixels 100. Moreover, the anode 12 which is formed on a per pixel 100 basis and the organic EL layer 13 which is formed on a per color (sub pixel column) basis or subpixel basis are formed in the opening formed by the banks 15. In addition, the transparent cathode 14 is formed on the organic EL layer 13 and the banks 15.

In addition, a fourth contact hole (hole) 174 is formed at a position that overlaps with the anode 12 and the relay electrode 55, and penetrating through the interlayer insulating film 11 in the thickness direction. In addition, the anode 12 is electrically connected to the relay electrode 55 formed in the third metal layer 170, via the fourth contact hole 174. It should be noted that the relay electrode 55 shown in FIG. 7 is configured of a center region that fills the third contact hole 173 and a flat region running along the circumference of an upper part of the third contact hole 173. In addition, the anode 12 is electrically connected at the flat region of the relay electrode 55.

As shown in FIG. 8, in the pixel 100 having the above-described configuration, the source wire 22 and the power wire 23 are formed in the second metal layer 140 which is the same layer as the source electrodes 42 and 53 and the drain electrodes 43 and 52. On the other hand, the gate wire 21 is formed in the third metal layer 170 which is a different layer from the source wire 22 and the power wire 23. In addition, the gate wire 21 and the source wire 22 cross each other and the gate wire 21 and the power wire 23 cross each other, with the passivation film 150 and the conductive oxide film 160 interposed in between.

As in the above described configuration, providing the respective wires (gate wire 21, source wire 22, and power wire 23) in a metal layer (second metal layer 140 and third metal layer 170) above the first metal layer 120 in which the gate electrodes 41 and 51 are formed allows the gate electrodes 41 and 51 and the respective wires to be formed from a material that is suitable to each one. Furthermore, compared to the gate insulating film 130, the thickness of the passivation film 150 can be set freely. With that, parasitic capacitance can be reduced by placing the respective wires in the second metal layer 140 and the third metal layer 170 which are adjacent in the stacking direction, with the passivation film 150 disposed between the second and third metal layers.

Next, the structure (the structure to the left of the break lines in FIG. 5 and FIG. 6) of terminal-parts 70 and 80 formed at the ends of the thin-film transistor array device 20 shall be described with reference to FIG. 5 and FIG. 6.

The terminal-part (the part to the left of the break lines) 70 shown in FIG. 5 is formed at each of two places, namely, at both ends of the pixels 100 which continue in the row direction. Each of the terminal-parts 70 includes: a terminal 71 formed from the same material as the conductive oxide film 160; a relay wire 72 formed in the second metal layer 140; and holes 73 and 74 which penetrate through the passivation film 150 in the thickness direction. The hole 73 is formed at a position that overlaps with one end of the relay wire 72, and electrically connects the terminal 71 and such end of the relay wire 72. In the same manner, the hole 74 is formed at a position that overlaps with the other end of the relay wire 72, and electrically connects the end of the gate wire 21 and the other end of the relay wire 72.

Specifically, the terminal-parts 70 are provided, one each, at both ends of the gate wire 21 which connects, on a per row basis, the pixels 100 that are arranged in rows and columns, and function as connections which connect the gate wire 21 and an external drive circuit. Here, since the terminal 71 is disposed so as to cover one end of the relay wire 72 that is exposed from the hole 73, it is possible to prevent the relay wire 72 from coming into contact with moisture in air, and the like, and becoming oxidized.

In the same manner, the terminal-part (the part to the left of the break lines) 80 shown in FIG. 6 is formed at two places, namely, at both ends of the pixels 100 which continue in the column direction. Each of the terminal-parts 80 includes a terminal 81 formed from the same material as the conductive oxide film 160, and a hole 82 which penetrates through the passivation film 150 in the thickness direction. The hole 82 is formed at a position that overlaps with the source wire 22, and electrically connects the terminal 81 and the end of the source wire 22.

Specifically, the terminal-parts 80 are provided, one each, at both ends of the source wire 22 which connects, on a per column basis, the pixels 100 that are arranged in rows and columns, and function as connections which connect the source wire 22 and an external drive circuit. Here, since the terminal 81 is disposed so as to cover the end of the source wire 22 that is exposed from the hole 82, it is possible to prevent the source wire 22 from coming into contact with the moisture, and so on, in air and becoming oxidized.

Next, a method of manufacturing the thin-film transistor array device 20 according to the present embodiment shall be described with reference to FIG. 9A to 12C. It should be noted that FIG. 9A to FIG. 9G are diagrams showing the structure of the cross-section along V-V in FIG. 4 corresponding to the manufacturing processes (a) to (f). FIG. 10A to FIG. 10C are diagrams showing details of the manufacturing process from 9F to 9G. FIG. 11A to FIG. 11H are diagrams showing the structure of the cross-section along VII-VII in FIG. 4 corresponding to the manufacturing processes (a) to (f). FIG. 12A to FIG. 12C are diagrams showing details of the manufacturing process between FIG. 11G and FIG. 11H.

Figure 9A:
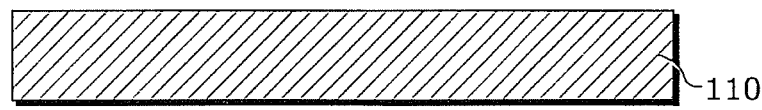
FIG. 9A is diagram showing a structure of the cross-section along V-V in FIG. 4 corresponding to a manufacturing process (a) of the thin-film transistor array device according to the embodiment.
Figure 10A:
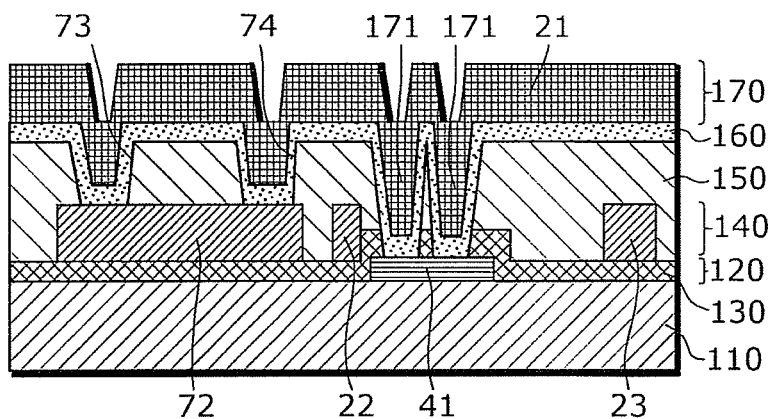
FIG. 10A is a diagram showing the structure of the cross-section along V-V in FIG. 4 corresponding to a part of a process of forming a terminal, a gate wire, and a relay electrode.
Figure 10B:
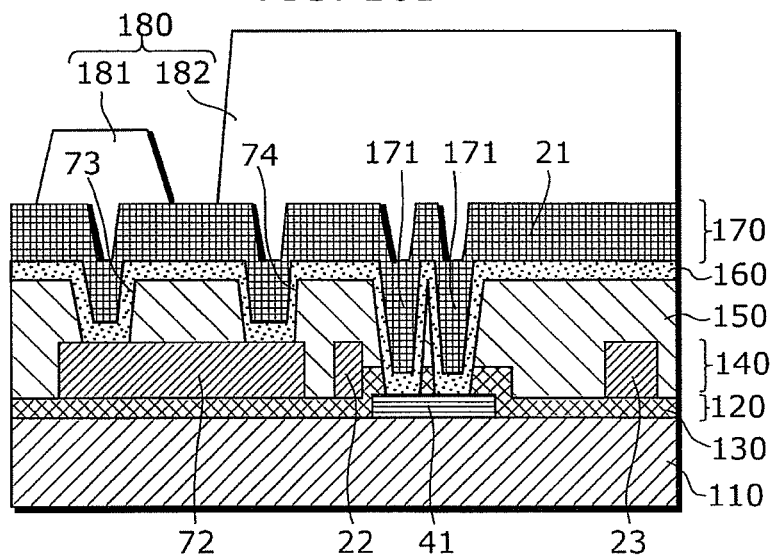
FIG. 10B is a diagram showing the structure of the cross-section along V-V in FIG. 4 corresponding to another part of the process of forming a terminal, a gate wire, and a relay electrode.
Figure 10C:
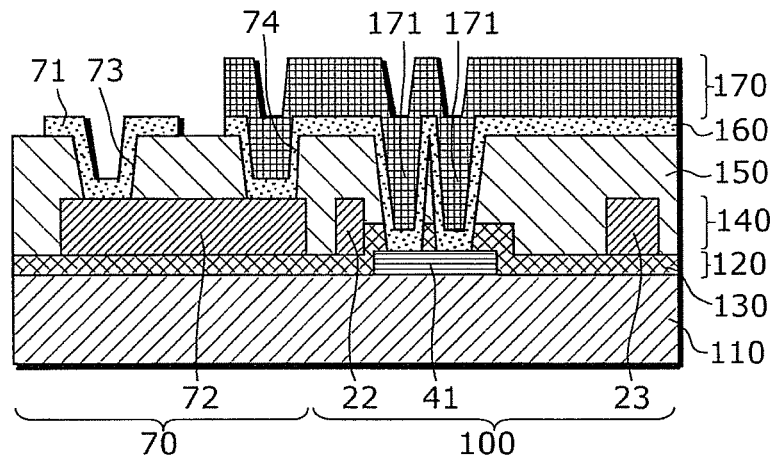
FIG. 10C is a diagram showing the structure of the cross-section along V-V in FIG. 4 corresponding to yet another part of the process of forming a terminal, a gate wire, and a relay electrode.

First, as shown in process (a) in FIG. 9A and FIG. 11, the substrate 110 is prepared. An insulating material such as glass, quartz, and the like, are typically used for the substrate 110. In order to prevent the spread of impurities from the substrate 110, a silicon oxide film or a silicon nitride film not illustrated in the figures may be formed on the upper surface of the substrate 110. The film thickness is approximately 100 nm.

Figure 9B:
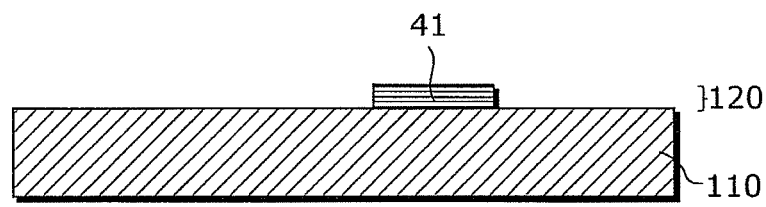
FIG. 9B is diagram showing the structure of the cross-section along V-V in FIG. 4 corresponding to a manufacturing process (b) of the thin-film transistor array device according to the embodiment.
Figure 9C:
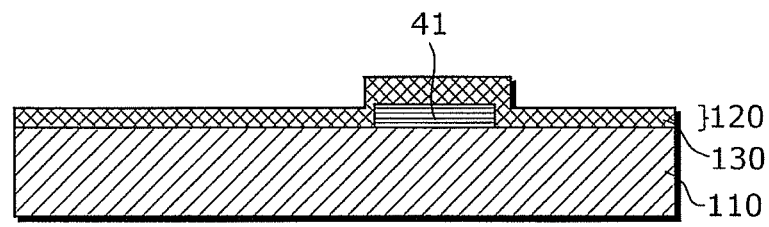
FIG. 9C is diagram showing the structure of the cross-section along V-V in FIG. 4 corresponding to a manufacturing process (c) of the thin-film transistor array device according to the embodiment.
Figure 11A:
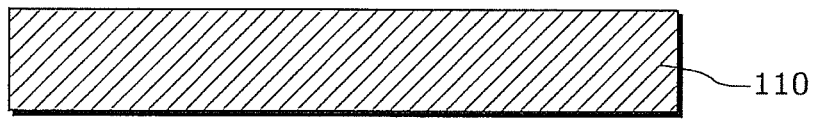
FIG. 11A is diagram showing a structure of the cross-section along VII-VII in FIG. 4 corresponding to the manufacturing process (a) of the thin-film transistor array device according to the embodiment.
Figure 11B:
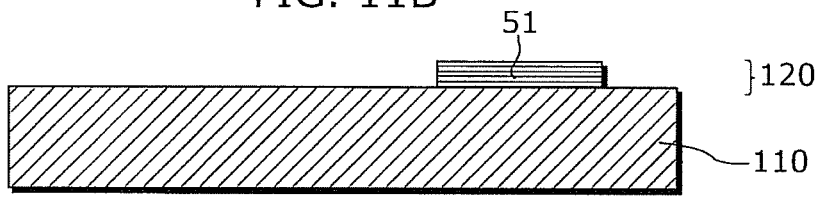
FIG. 11B is diagram showing a structure of the cross-section along VII-VII in FIG. 4 corresponding to the manufacturing process (b) of the thin-film transistor array device according to the embodiment.
Figure 11C:
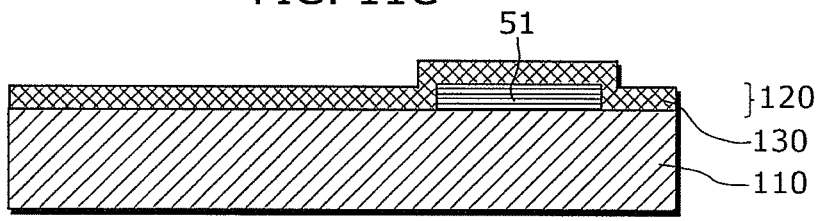
FIG. 11C is diagram showing the structure of the cross-section along VII-VII in FIG. 4 corresponding to a part of the manufacturing process (c) of the thin-film transistor array device according to the embodiment.
Figure 12A:
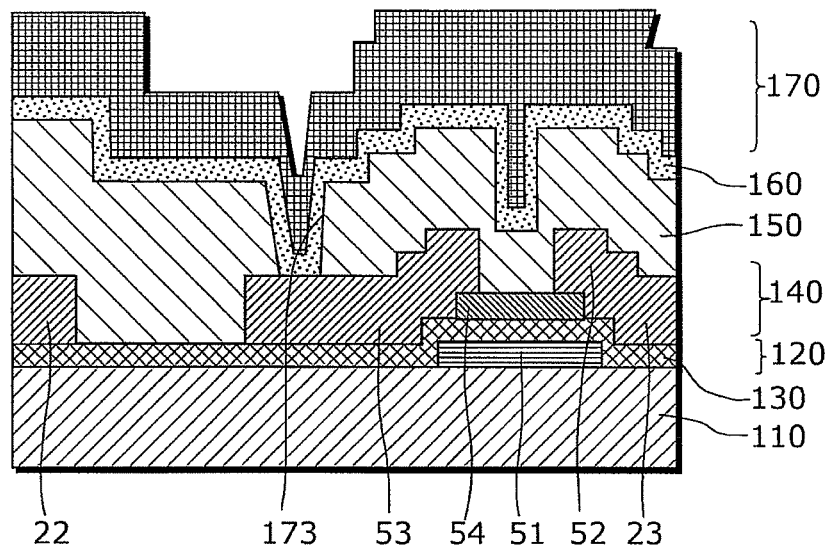
FIG. 12A is a diagram showing the structure of the cross-section along VII-VII in FIG. 4 corresponding to a part of the process of forming a terminal, a gate wire, and a relay electrode.
Figure 12B:
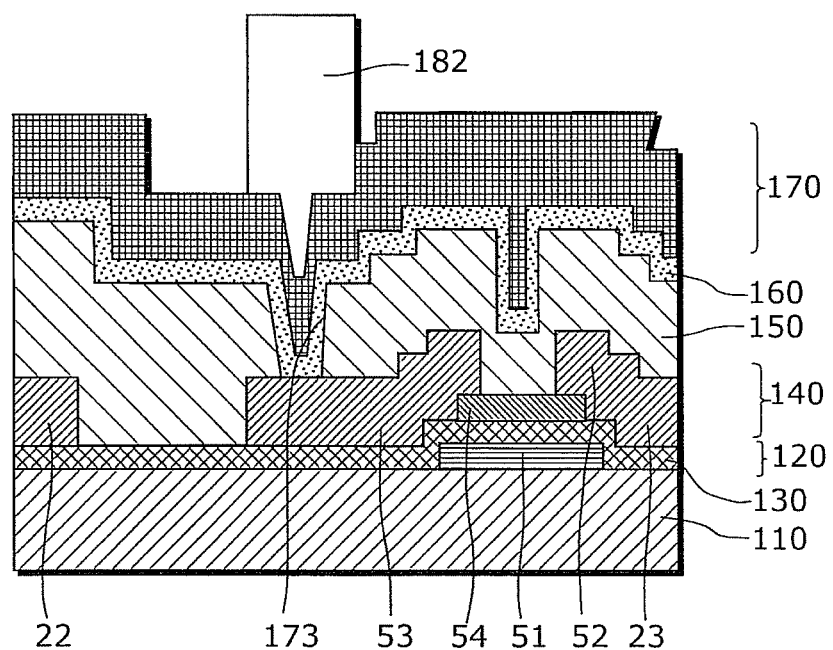
FIG. 12B is a diagram showing the structure of the cross-section along VII-VII in FIG. 4 corresponding to another part of the process of forming a terminal, a gate wire, and a relay electrode.
Figure 12C:
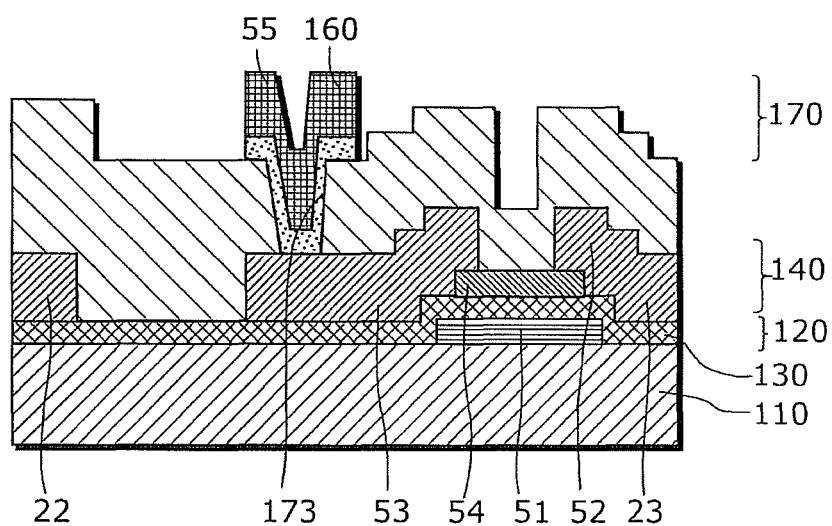
FIG. 12C is a diagram showing the structure of the cross-section along VII-VII in FIG. 4 corresponding to yet another part of the process of forming a terminal, a gate wire, and a relay electrode.

Next, as shown in process (b) in FIG. 9B and FIG. 11B, after the heat-resistant first metal layer 120 is formed on the substrate 110, patterning is performed by photolithography, etching, and the like, and the gate electrodes 41 and 51 are formed. Any one of Mo, W, Ta, Ti, and Ni, which are heat resistant, or an alloy of these is used as a material. Mo is used in the present embodiment. A thickness of approximately 100 nm is preferable.

Next, as shown in process (c) in FIG. 9C and FIG. 11C to FIG. 11E, the gate insulating film 130 is formed on the substrate 110 and the first metal layer 120, and a semiconductor layer is formed on the gate insulating film 130. It should be noted that the gate insulating film 130 and the semiconductor layer are formed successively by plasma CVD, and so on, without breaking the vacuum. A silicon oxide film, a silicon nitride film, or a composite film of these is formed as the gate insulating film 130. Thickness is approximately 200 nm. Furthermore, the semiconductor layer is an approximately 50 nm amorphous silicon film.

Figure 11D:
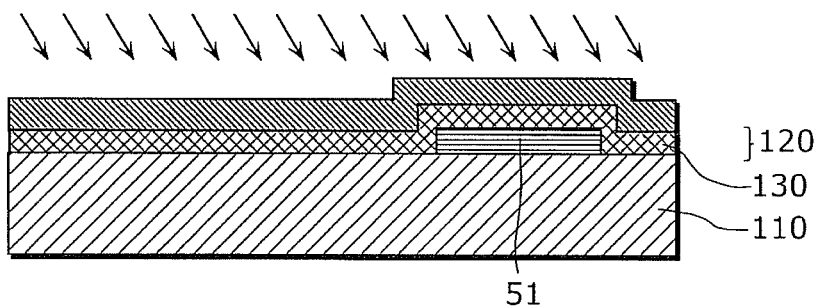
FIG. 11D is diagram showing a structure of the cross-section along VII-VII in FIG. 4 corresponding to another part of the manufacturing process (c) of the thin-film transistor array device according to the embodiment.

Subsequently, for example, as indicated by the arrows in FIG. 11D, by irradiating an excimer laser, and the like, on the semiconductor layer, the semiconductor layer is reformed from an amorphous semiconductor layer to a polycrystalline semiconductor. As a crystallization method, for example, after performing dehydrogenation in a 400° C. to 500° C. furnace, crystallization is caused using an excimer laser, after which hydrogen plasma processing is performed in a vacuum over a few seconds to a few tens of seconds. More specifically, the amorphous semiconductor layer is crystallized by raising its temperature to within a predetermined temperature range, by irradiation with an excimer laser, and the like. Here, the predetermined temperature range is, for example, from 1100° C. to 1414° C. Furthermore, average crystal grain size within the polycrystalline semiconductor ranges from 20 nm to 60 nm.

Here, since the first metal layer 120 which forms the gate electrodes 41 and 51 is exposed to high temperature in the above-described process, it is necessary to form the first metal layer 120 from a metal having a melting point that is higher than the upper limit (1414° C.) of the aforementioned temperature range. On the other hand, the second metal layer 140 and the third metal layer 170 that are stacked in subsequent processes may be formed from metal having a lower melting point than the lower limit (1100° C.) of the aforementioned temperature range.

Figure 11E:
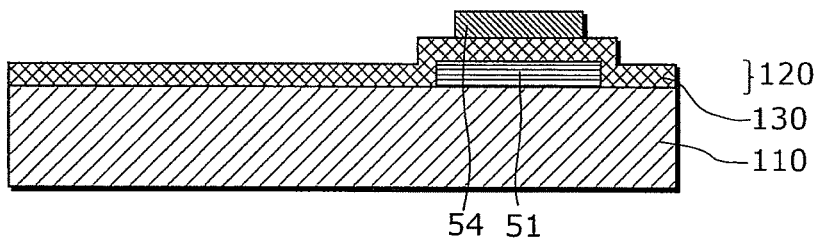
FIG. 11E is diagram showing a structure of the cross-section along VII-VII in FIG. 4 corresponding to yet another part of the manufacturing process (c) of the thin-film transistor array device according to the embodiment.

Next, as shown in FIG. 11E, the semiconductor layer is formed into the island-shaped semiconductor films 44 and 54 using photolithography, etching, and so on. In addition, a second through-hole (not illustrated) is formed in the gate insulating film 130 likewise using photolithography, etching, and so on. The second through-hole later becomes the second contact hole 172.

Figure 9D:
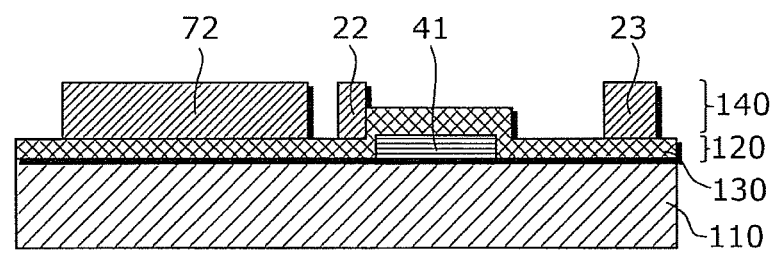
FIG. 9D is diagram showing the structure of the cross-section along V-V in FIG. 4 corresponding to a manufacturing process (d) of the thin-film transistor array device according to the embodiment.
Figure 11F:
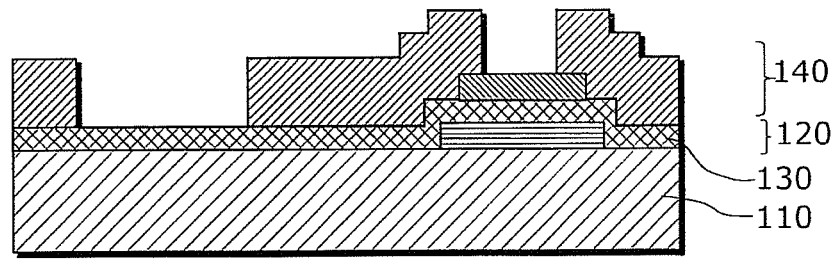
FIG. 11F is diagram showing a structure of the cross-section along VII-VII in FIG. 4 corresponding to the manufacturing process (d) of the thin-film transistor array device according to the embodiment.

Subsequently, as shown in process (d) in FIG. 9D and FIG. 11F, the second metal layer 140 is formed on the gate insulating film 130 and the semiconductor films 44 and 54, and the source wire 22, the power wire 23, the source electrodes 42 and 53, the drain electrodes 43 and 52, and the relay wire 72 are formed by patterning. At this time, the material making up the second metal layer 140 is also filled into the second through-hole (not illustrated), thereby forming the second contact hole 172. With this process, the gate electrode 51 and the drain electrode 43 are electrically connected via the second contact hole 172.

Any one of Al, Cu, and Ag, which are low-resistance metals, or an alloy of these is used as a material for the second metal layer 140. In the present embodiment, Al is used and the thickness is approximately 300 nm.

Furthermore, typically, a low-resistance semiconductor layer which is not illustrated is formed between the source electrode 42 and the semiconductor film 44 and between the drain electrode 43 and the semiconductor film 44. An amorphous silicon layer that is doped with an n-type dopant such as phosphorous or an amorphous layer doped with a p-type dopant such as boron is typically used for this low-resistance semiconductor layer. Thickness is approximately 20 nm. A semiconductor layer of amorphous silicon and the like may be additionally formed between the crystallized semiconductor film 44 and the doped crystalline silicon layer. There are cases where these films are required in order to improve device characteristics. The same is done for the semiconductor film 54.

Figure 9E:
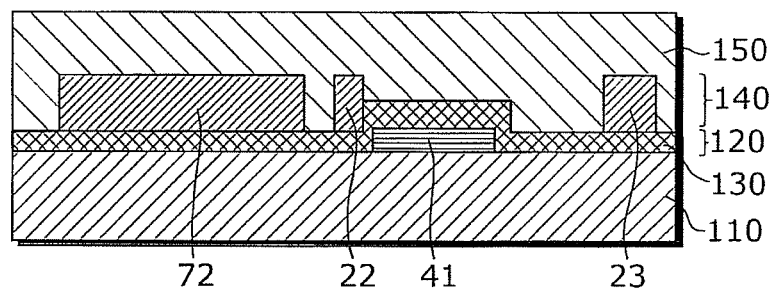
FIG. 9E is diagram showing the structure of the cross-section along V-V in FIG. 4 corresponding to a part of a manufacturing process (e) of the thin-film transistor array device according to the embodiment.
Figure 9F:
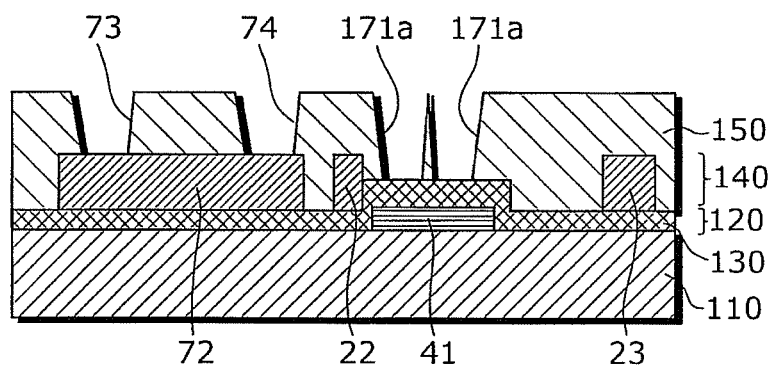
FIG. 9F is diagram showing the structure of the cross-section along V-V in FIG. 4 corresponding to another part of a manufacturing process (e) of the thin-film transistor array device according to the embodiment.
Figure 11G:
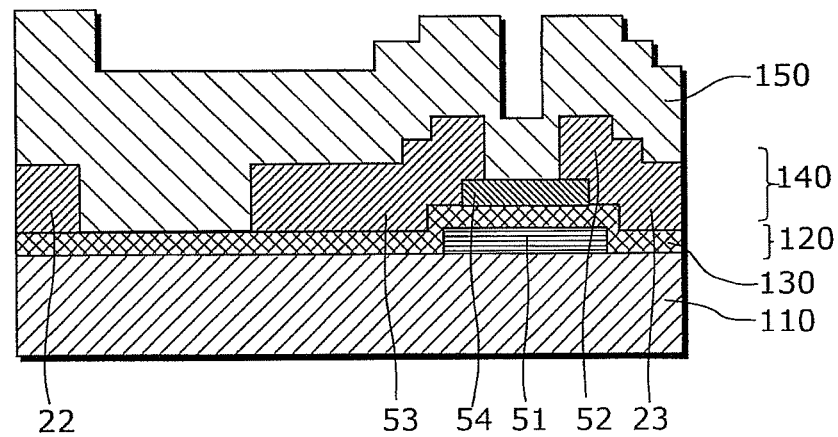
FIG. 11G is diagram showing a structure of the cross-section along VII-VII in FIG. 4 corresponding to the manufacturing process (e) of the thin-film transistor array device according to the embodiment.

Subsequently, as shown in process (e) in FIG. 9E, FIG. 9F, and FIG. 11G, the passivation film 150, which is made of a silicon oxide film, a silicon nitride film, or a laminated film of such films, is formed on the gate insulating film 130, the semiconductor films 44 and 54, and the second metal layer 140. Furthermore, the following holes are formed in the passivation film 150 by photolithography, etching, and so on: a first through-hole 171a which successively penetrates through the gate insulation layer 130 and the passivation film 150; a third through-hole (not illustrated) and the holes 73, 74, 82 which penetrate through the passivation film 150 in the thickness direction The first through-hole 171a later becomes the first contact hole 171, and the third through-hole later becomes the third contact hole 173.

Here, materials and the thickness of the gate insulating film 130 and the passivation film 150 are determined so that the per unit area capacitance formed in the passivation film 150 disposed between the second metal layer 140 and the third metal layer 170 is smaller than the per unit area capacitance formed in the gate insulating film 130 disposed between the first metal layer 120 and the second metal layer 140. More specifically, it is preferable that the per unit area capacitance formed in the passivation film 150 be below $1.5 \times 10^{-4}$ (F/m$^2$). Meanwhile, it is preferable that the per unit area capacitance formed in the passivation film 150 be equal to or greater than $1.5 \times 10^{-4}$ (F/m$^2$).

Figure 9G:
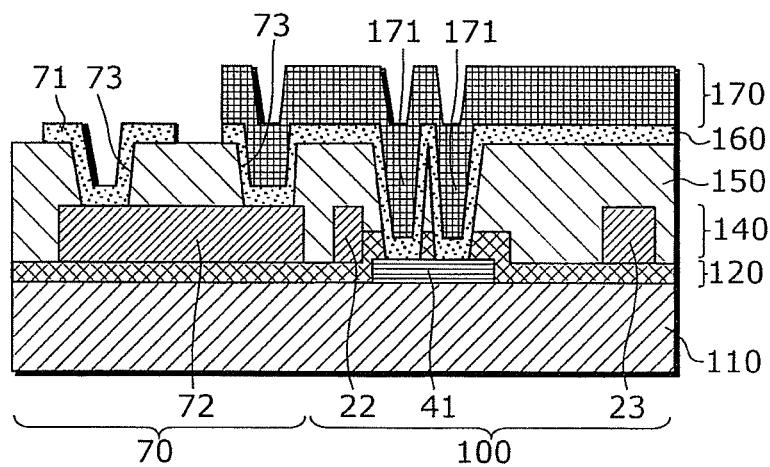
FIG. 9G is diagram showing the structure of the cross-section along V-V in FIG. 4 corresponding to a manufacturing process (f) of the thin-film transistor array device according to the embodiment.
Figure 11H:
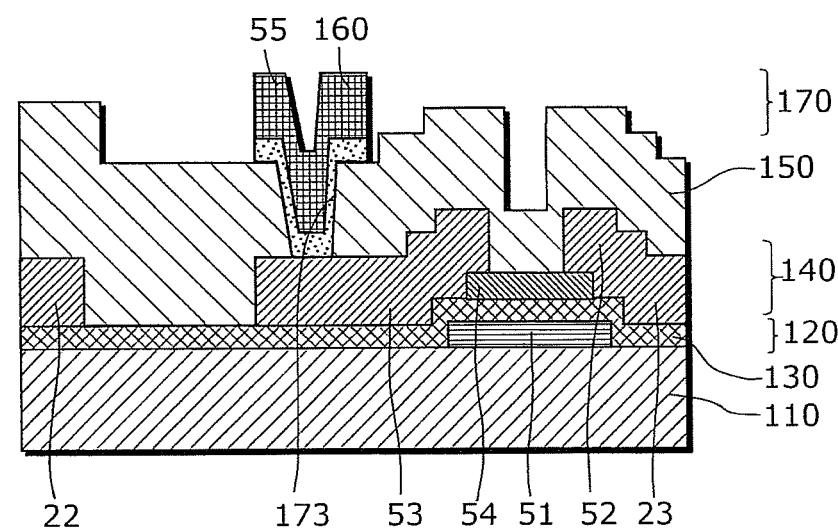
FIG. 11H is diagram showing a structure of the cross-section along VII-VII in FIG. 4 corresponding to the manufacturing process (f) of the thin-film transistor array device according to the embodiment.

In addition, as shown in process (f) in FIG. 9G and FIG. 11H, the conductive oxide film 160 is formed on the passivation film 150, and the third metal layer 170 is formed on the conductive oxide film 160. Then, the third metal layer 170 is formed into the gate wire 21 and the relay electrode 55 by patterning. The process of forming the gate wire 21 and the relay electrode 55 shall be described later using FIG. 10A to FIG. 10C and FIG. 12A to FIG. 12C.

The material making up the conductive oxide film 160 is an oxide layer including indium and tin or an oxide film including indium and zinc. Meanwhile, the material making up the third metal layer 170 may be of the same metal as the second metal layer 140 since low resistance is required. However, the surface of the third metal layer 170 that is in contact with the conductive oxide film 160 is formed from a metal including at least one of copper, molybdenum, titanium, or tungsten. For example, the second metal layer 140 may be of a layered structure in which 30 nm of Al is formed after forming 50 nm of Mo as a barrier metal. When lower resistance is required, there are cases where Cu is used instead of Al (in this case, a barrier metal is unnecessary). Furthermore, increasing the thickness can realize further lower resistance.

At this time, the material making up the conductive oxide film 160 and the third metal layer 170 is also filled into the first and third through-holes (not illustrated), thereby forming the first contact hole 171 and the second contact hole 173. With this, the gate wire 21 and the gate electrode 41 are electrically connected via the first contact hole 171, and the source electrode 53 and the relay electrode 55 are electrically connected via the third contact hole 173.

The process of forming the gate wire 21 and the relay electrode 55 shall be described in detail with reference to FIG. 10A to FIG. 10C and FIG. 12A to FIG. 12C. Specifically, an example in which the conductive oxide film 160 and the third metal layer 170 are simultaneously processed using a half-tone mask shall be described.

First, as shown in FIG. 10A and FIG. 12A, the conductive oxide film 160 and the third metal layer 170 are formed above the passivation film 150. In this process, the conductive oxide film 160 and the third metal layer 170 are formed on the entire surface of the pixel 100.

Next, as shown in FIG. 10B and FIG. 12B, a photosensitive resist film 180 is formed on the third metal layer 170. The photosensitive resist film 180 includes a relatively thin first photosensitive resist film 181 and a relatively thick second photosensitive resist film 182.

The first photosensitive resist film 181 is formed at a position that overlaps the parts that are to become the terminals 71 and 81 after processing. On the other hand, the second photosensitive resist film 182 is formed at a position that overlaps the parts that are to become the gate wire 21 and the relay electrode 55 after processing. Meanwhile, the photosensitive resist film 180 is not formed on the rest of the regions, that is, the part from which the conductive oxide film 160 and the third metal layer 170 are to be eventually removed.

Next, as shown in FIG. 10C and FIG. 12C, the terminals 71 and 81, the gate wire 21, and the relay electrode 55 are patterned by etching. Specifically, in the position of the first photosensitive resist film 181, the third metal layer 170 is removed, and only the conductive oxide film 160 remains. Here, the remaining conductive oxide film 160 becomes the terminals 71 and 81. On the other hand, in the position of the second photosensitive resist film 182, conductive oxide film 160 and the third metal layer 170 remain. Here the remaining conductive oxide film 160 and third metal layer 170 become the gate wire 21 and the relay electrode 55. In other words, the gate wire 21 and the relay electrode 55 are formed from the same material.

In this manner, by processing the conductive oxide film 160 and the third metal layer 170 using a half-tone mask, mask reduction becomes possible and simplification of the manufacturing process and reduction of manufacturing cost become possible.

Next, although illustration has been omitted, a method of manufacturing the organic EL display 10 according to the present embodiment shall be described. Specifically, a method of sequentially stacking the interlayer insulating film 11, the banks 15, the anode 12, the organic EL layer 13, and the transparent cathode 14 on the thin-film transistor array device 20 shall be described.

First, the interlayer insulating film 11 is formed on the third metal layer 170. Subsequently, a fourth through-hole (not illustrated) penetrating through the interlayer insulating film 11 is formed by photolithography, etching, and so on. The fourth through-hole later becomes the fourth contact hole 174.

Next, the banks 15 are formed at positions on the interlayer insulating film 11 that correspond to the boundaries of the respective pixels 100. In addition, the anode 12 is formed on the interlayer insulating film 11, inside the openings formed by the banks 15, for each of the pixels 100. At this time, the material making up the anode 12 is filled into the fourth through-hole, thereby forming the fourth contact hole 174. The anode 12 and the relay electrode 55 are electrically connected via the fourth contact hole 174.

The material of the anode 12 is, for example, any one of: a conductive metal such as molybdenum, aluminum, gold, silver, copper or an alloy of these; an organic conductive material such as PEDOT: PSS; zinc oxide or lead indium oxide. A film formed from any of these materials is created by vacuum deposition, RF sputtering, or printing, and an electrode pattern is formed.

The organic EL layer 13 is formed on the anode 12 and within the opening formed by the banks 15, for each color (subpixel column) or each sub pixel. The organic EL layer 13 is configured by stacking the respective layers of a hole injection layer, a hole transport layer, a light-emitting layer, an electron transport layer, an electron injection layer, and so on. For example, it is possible to use copper phthalocyanine for the hole injection layer, α-NPD (Bis[N-(1-Naphthyl)-N-Phenyl]benzidine) for the hole transport layer, $Alq_3$ (tris (8-hydroxyquinoline) aluminum) for the light-emitting layer, an oxazole derivative for the electron transport layer, and $Alq_3$ for the electron injection layer. It should be noted that these materials are but one example and that other materials may be used.

The transparent cathode 14 is a permeable electrode that is continuously formed on the organic EL layer 13. The material of the transparent cathode 14 is, for example, ITO, $SnO_2$, $In_2O_3$, ZnO, or a combination of these.

(Modifications)

Next, a modification of the terminal-part 70 shown in FIG. 5 shall be described with reference to FIG. 13 and FIG. 14. In a terminal-part 70a shown in FIG. 13, a terminal 71a is formed by extending the end of the conductive oxide film 160 that overlaps with the gate wire 21. Specifically, in the example shown in FIG. 13, the conductive oxide film 160 formed below the gate wire 21 is extended from the end of the gate wire 21 formed using the third metal layer 170, and the exposed part of the conductive oxide film 160 serves as the terminal 71a. Compared to the example in FIG. 5, this allows the relay wire 72 and the holes 73 and 74 to be omitted.

Figure 13:
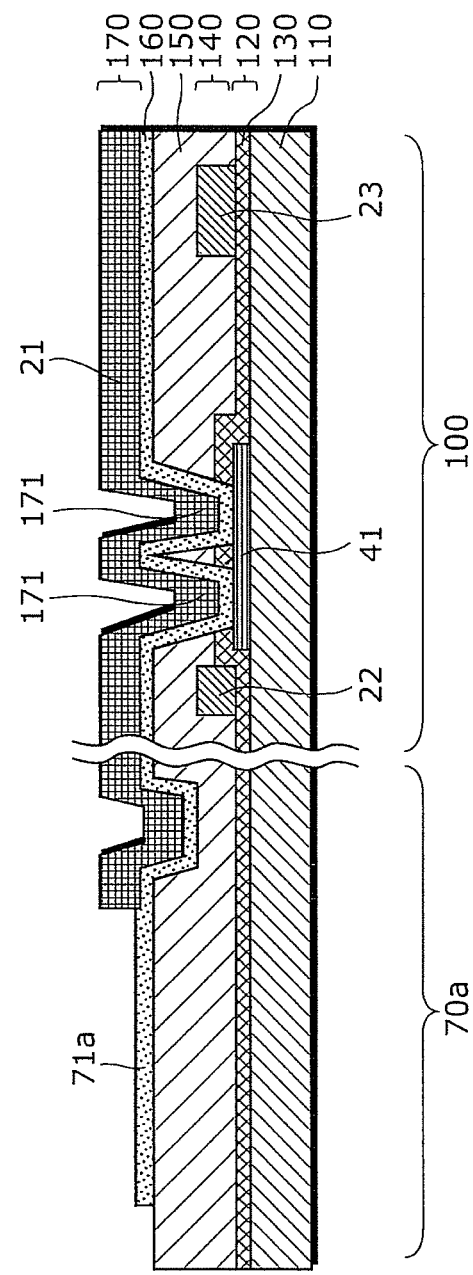
FIG. 13 is a diagram showing modification of FIG. 5.
Figure 14:
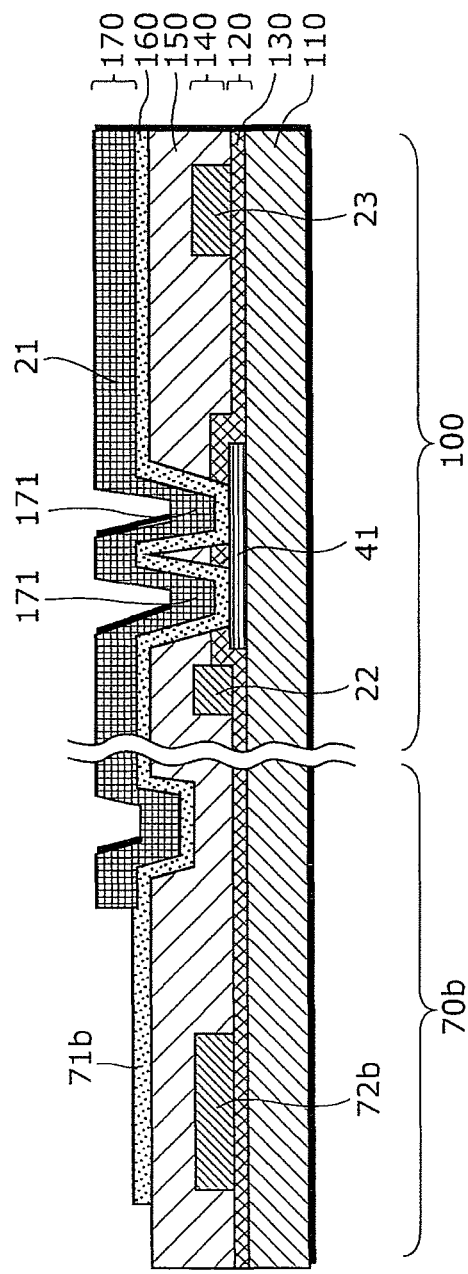
FIG. 14 is a diagram showing another modification of FIG. 5.

Furthermore, in a terminal-part 70b shown in FIG. 14, in addition to the configuration in FIG. 13, an elastic body 72b is disposed at a position that overlaps with the terminal 71b of the second metal layer 140. The elastic body 72b can be formed from the same material as the second metal layer 140. The elastic body 72b disposed directly below the terminal 71b serves as a cushion when the terminal 71b and an external driver circuit are electrically joined using, for example, Anisotropic Conductive Film (ACF), or wire bonding, and so on. As a result, the junction can be performed reliably, and thus the reliability of the electrical connection can be enhanced.

Figure 15:
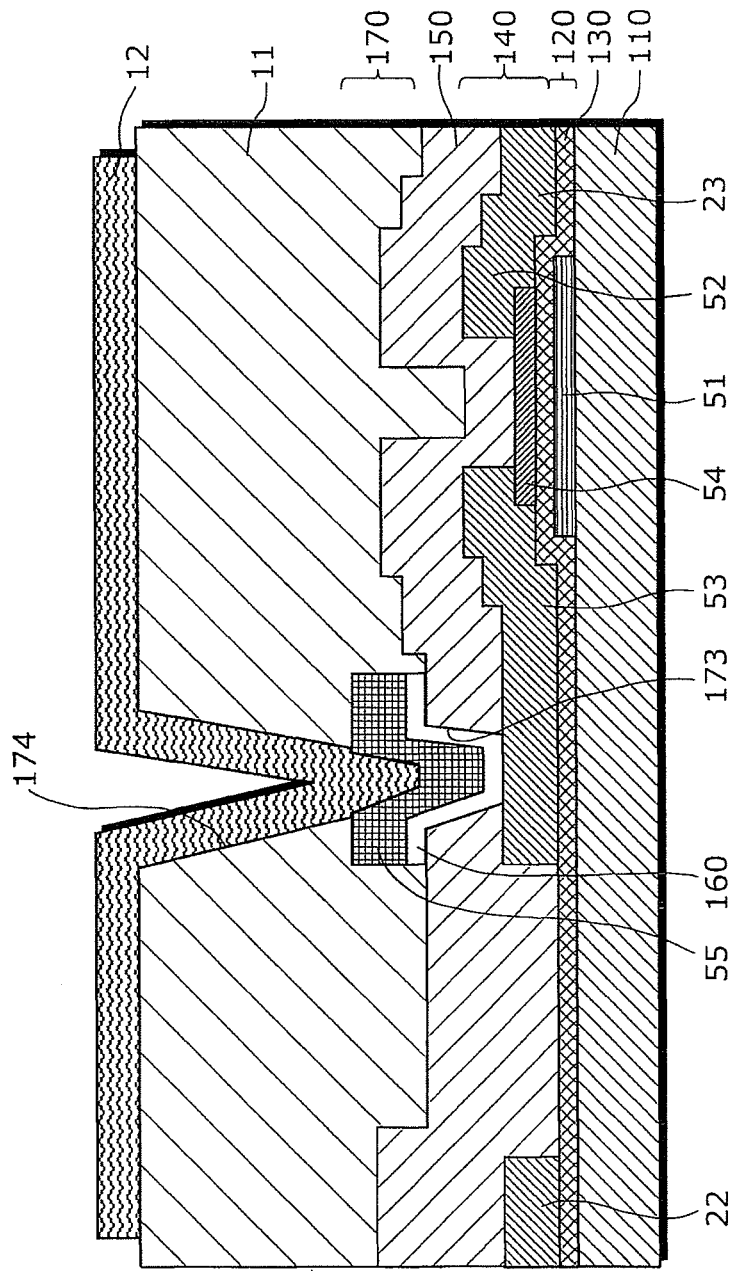
FIG. 15 is a diagram showing a modification of FIG. 7.
Figure 16:
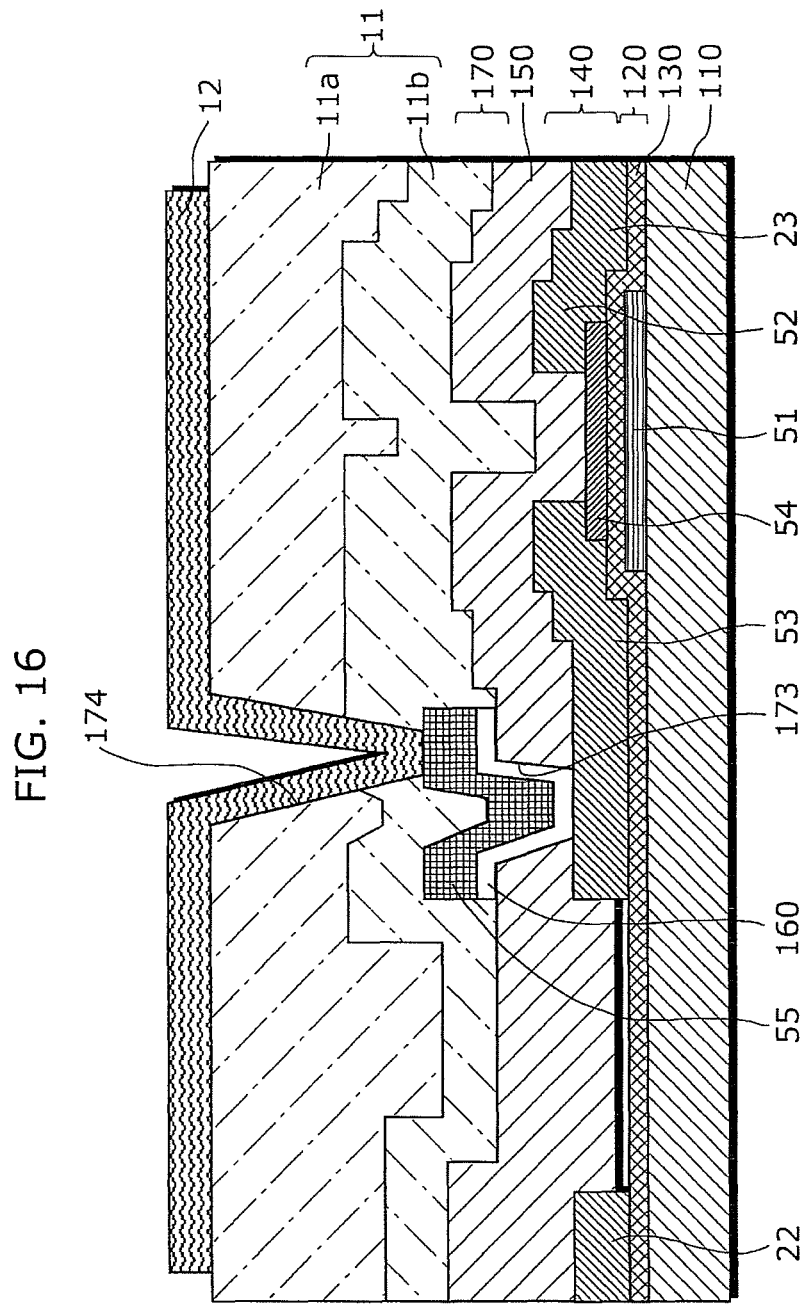
FIG. 16 is a diagram showing another modification of FIG. 7.
Figure 17:
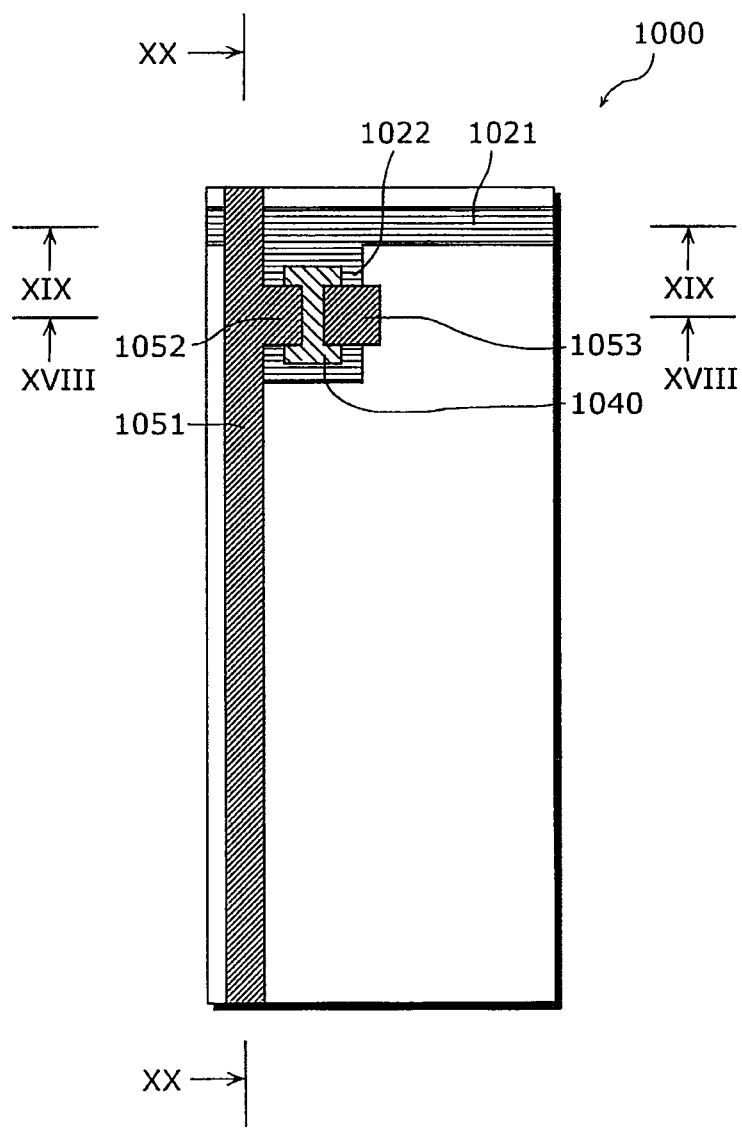
FIG. 17 is a front view showing a configuration of a conventional pixel.
Figure 18:
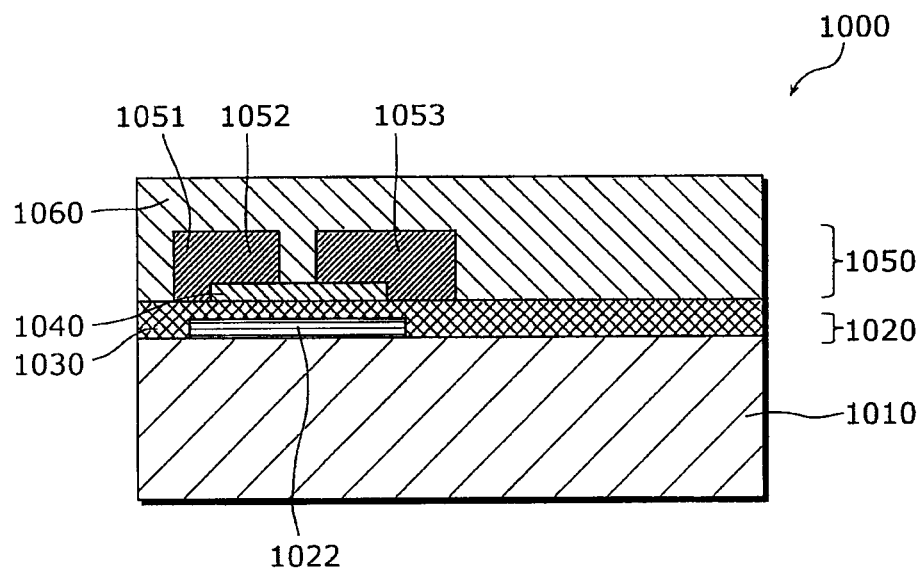
FIG. 18 is a cross-sectional view along XVIII-XVIII in FIG. 17.
Figure 19:
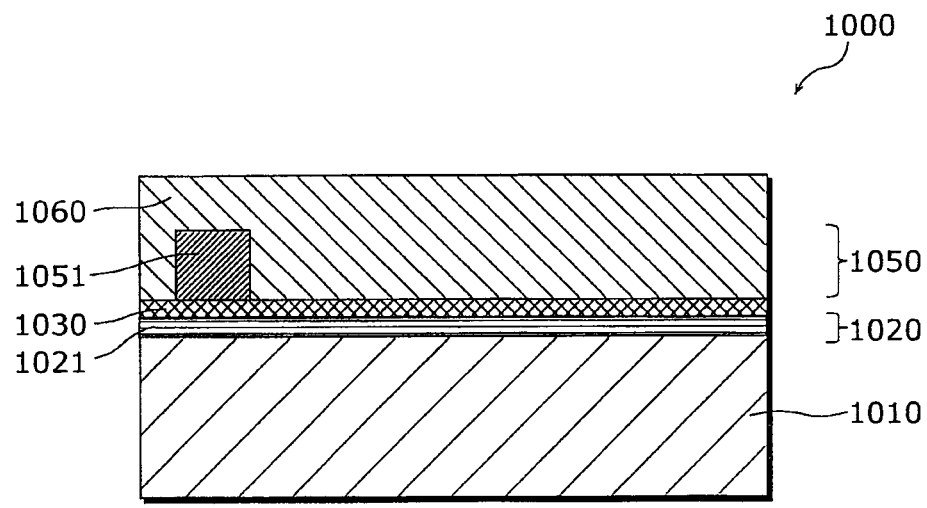
FIG. 19 is a cross-sectional view along XIX-XIX in FIG. 17.
Figure 20:
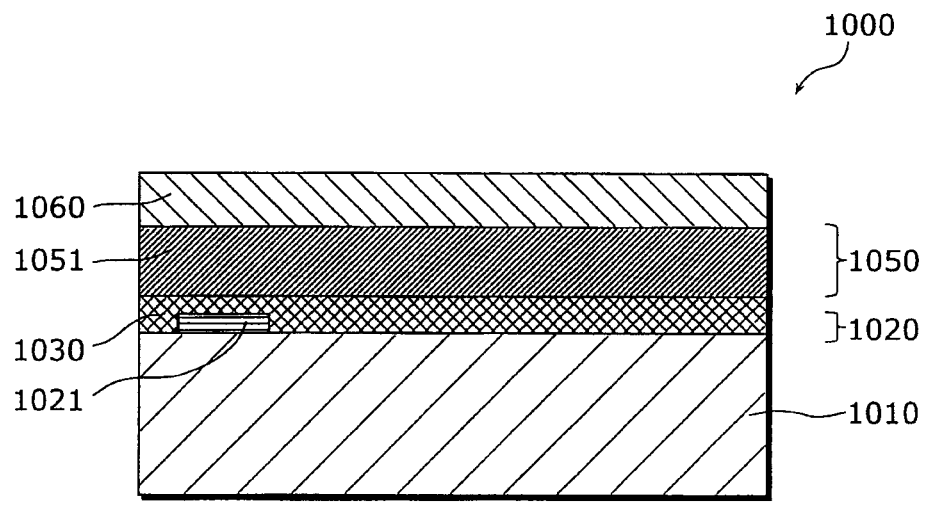
FIG. 20 is a cross-sectional view along XX-XX in FIG. 17.
Figure 21:
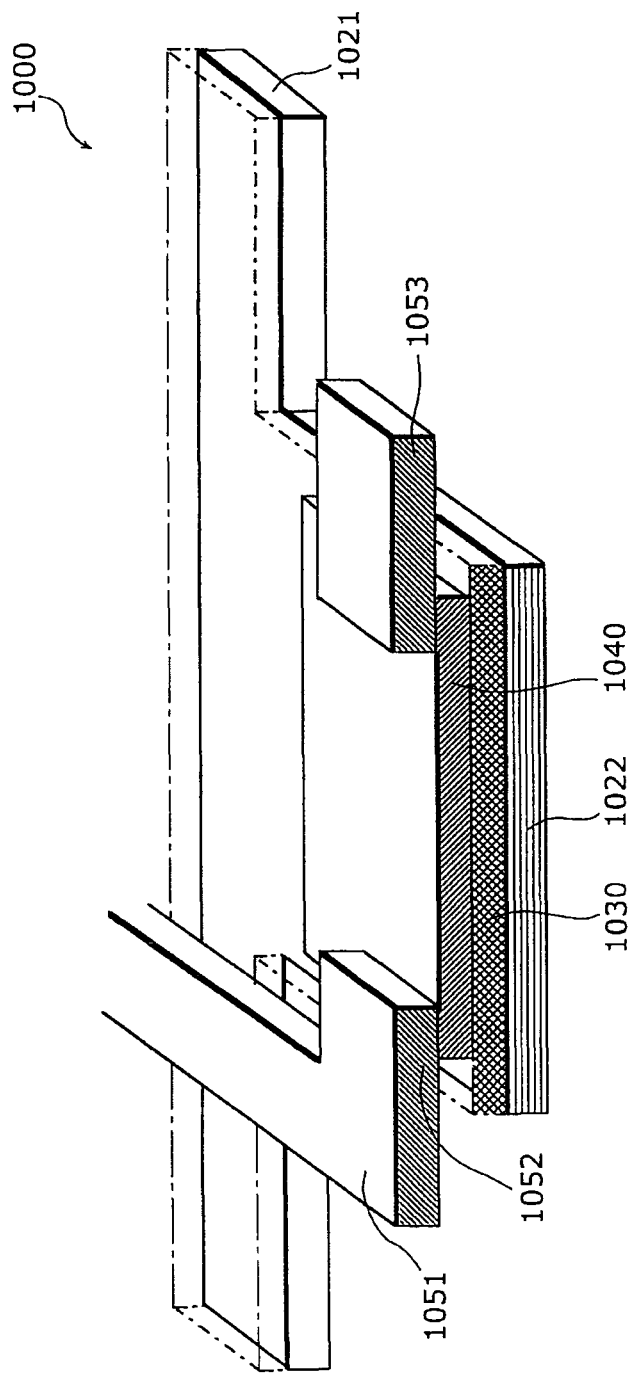
FIG. 21 is a perspective view of main parts as seen from the cross-section along XVIII-XVIII in FIG. 17.

Next, a modification of FIG. 7 shall be described with reference to FIG. 15 and FIG. 16. FIG. 15 shows an example in which the anode 12 is electrically connected to the center region of the relay electrode 55. Furthermore, FIG. 16 shows an example in which the interlayer insulating film 11 includes two layers composed of an organic film 11a and an inorganic film 11b. Here, the organic film 11a is disposed on the side of the interlayer film 11 that is in contact with the anode 12 (upper layer), and the inorganic film 11b is disposed on the side that is in contact with the gate wire 21 and the relay electrode 55 (lower layer).

It should be noted that although the present embodiment shows the case where two TFTs are included in the pixel 100, the applicable range of the present invention is not limited to such case. The same configuration can be applied in the case where a pixel 100 includes plural (three or more) TFTs in order to compensate for TFT variation within the pixel 100.

Furthermore, although a pixel configuration for driving the organic EL element is shown in the present embodiment, the present invention is not limited to such configuration. The present invention can be applied to all thin-film transistor array devices 20 configured using a TFT, such as liquid crystals, inorganic ELs, and so on.

Furthermore, although the present embodiment shows and example in which, among the first metal layer 120, the second metal layer 140, and the third metal layer 170 which are adjacent to each other in the stacking direction, the gate electrodes 41 and 51 are formed in the first metal layer 120, the source wire 22 and the power wire 23 are formed in the second metal layer 140, and the gate wire 21 is formed in the third metal layer 170, the applicable range of the present invention is not limited to such case. Specifically, even when a metal layer is further formed between the first metal layer 120 and the second metal layer 140 and between the second metal layer 140 and the third metal layer 170, the advantageous effect of the present invention can be obtained as long as the gate wire 21, the source wire 22, and the power wire 23 are disposed on a metal layer that is above the gate electrodes 41 and 51.

Although the embodiment of the present invention is described with reference to the Drawings, the present invention is not limited to the illustrated embodiment. Various adjustments and modifications may be added to the illustrated embodiment within a scope that is the same as that of the present invention or within an equivalent scope.

Although only an exemplary embodiment of this invention has been described in detail above, those skilled in the art will readily appreciate that many modifications are possible in the exemplary embodiment without materially departing from the novel teachings and advantages of this invention. Accordingly, all such modifications are intended to be included within the scope of this invention.

INDUSTRIAL APPLICABILITY

The image display device use thin-film transistor array device according to the present invention is useful as a driving backplane used in an organic EL display device, a liquid crystal display device, and so on.

What is claimed is:

1. A thin-film transistor array device, the thin-film transistor array device being stacked with an electroluminescence layer, an interlayer insulating film between the electroluminescence layer and the thin-film transistor array device, the electroluminescence layer including electroluminescence light-emitting elements that each include a lower electrode, the thin-film transistor array device comprising:
a substrate;
a first transistor above the substrate and including a first transistor gate electrode and a first transistor source electrode;
a second transistor including a current-supply electrode for supplying current, the current-supply electrode being electrically connected to the lower electrode;
a passivation film between the interlayer insulating film and both the first transistor and the second transistor;
a source wire above the substrate and below the passivation film in a first layer, the source wire being electrically connected to the first transistor source electrode;
a gate wire transverse to the source wire and above the passivation film in a second layer different than the first transistor gate electrode, the gate wire being electrically connected to the first transistor gate electrode via a first hole in the passivation film;
a relay electrode above the passivation film in the second layer and overlapping with the current-supply electrode for being a relay between the current-supply electrode and the lower electrode; and
a conductive oxide film above the passivation film and between the passivation film and both the gate wire and the relay electrode, the conductive oxide film being electrically disconnected between the gate wire and the relay electrode;
wherein the first transistor and the second transistor are bottom gate transistors,
an end portion of the source wire is exposed through the passivation film via a second hole in the passivation film, the end portion of the source wire being connectible with a source driving circuit that is outside the thin-film transistor array device,
the conductive oxide film covers the end portion of the source wire that is exposed through the passivation film via the second hole,
the current-supply electrode is electrically connected to the lower electrode via a third hole in the passivation film,
the conductive oxide film is between the current-supply electrode and the relay electrode and electrically connects the and the current-supply electrode and the relay electrode, and
the relay electrode comprises a same material as the gate wire.

2. The thin-film transistor array device according to claim 1, wherein the lower electrode comprises a metal primarily composed of aluminum.

3. The thin-film transistor array device according to claim 1, wherein the gate wire and the relay electrode each include a surface that is in contact with the conductive oxide film and comprises a metal that includes at least one of copper, molybdenum, titanium, and tungsten.

4. The thin-film transistor array device according to claim 1, wherein the gate wire and the relay electrode include a layered structure.

5. The thin-film transistor array device according to claim 1, wherein the interlayer insulating film includes an organic film layer and an inorganic film layer, and the inorganic film layer covers the gate wire and the relay electrode.

6. The thin-film transistor array device according to claim 1,
wherein the first transistor and the second transistor each include a crystalline semiconductor layer, and
the first transistor gate electrode and a second transistor gate electrode included in the second transistor comprise a first metal having higher heat-resistance than a second metal of which the gate wire comprises.

7. The thin-film transistor array device according to claim 6,
wherein the first metal includes one of molybdenum, tungsten, titanium, tantalum, and nickel.

8. The thin-film transistor array device according to claim 1,
wherein the conductive oxide film comprises indium and one of tin and zinc.

9. The thin-film transistor array device according to claim 1,
wherein a relay wire is on a gate insulating film,
an end portion of the gate wire is connected, via the conductive oxide film, to a first end portion of the relay wire,
a second end portion of the relay wire is exposed through a fourth hole in the passivation film and is connectable with a gate driving circuit that is outside the thin-film transistor array device, and
the conductive oxide film covers the second end portion of the relay wire that is exposed through the fourth hole.

10. The thin-film transistor array device according to claim 9,
wherein the relay wire is in the first layer and comprises a same material as the source wire.

11. The thin-film transistor array device according to claim 1,
wherein the conductive oxide layer is below the gate wire and extends beyond an end of the gate wire and is exposed, and
an exposed region of the conductive oxide layer is connectable with a gate driving circuit that is outside the thin-film transistor array device.

12. The thin-film transistor array device according to claim 11,
wherein an elastic body is above a gate insulating film and overlaps with at least a portion of the exposed region of the conductive oxide film that is connectable with the gate driving circuit.

13. The thin-film transistor array device according to claim 12,
wherein the elastic body is in the first layer and comprises a same material as the source wire.

14. An electroluminescence display panel, comprising:
an upper electrode;
a lower electrode;
an electroluminescence layer including an electroluminescence light-emitting element that includes a light-emitting function layer between the upper electrode and the lower electrode;
a thin-film transistor array device for controlling the electroluminescence light-emitting element; and
an interlayer insulating film between the electroluminescence layer and the thin-film transistor array device,
wherein the lower electrode is electrically connected to the thin-film transistor array device via a contact hole in the interlayer insulating film,
the thin-film transistor array device includes:
a substrate;
a first transistor above the substrate and including a first transistor gate electrode and a first transistor source electrode;
a second transistor including a current-supply electrode for supplying current, the current-supply electrode being electrically connected to the lower electrode;
a passivation film between the interlayer insulating film and both the first transistor and the second transistor;
a source wire above the substrate and below the passivation film in a first layer, the source wire being electrically connected to the first transistor source electrode;
a gate wire transverse to the source wire and above the passivation film in a second layer different than the first transistor gate electrode, the gate wire being electrically connected to the first transistor gate electrode via a first hole in the passivation film;
a relay electrode above the passivation film in the second layer and overlapping with the current-supply electrode for being a relay between the current-supply electrode and the lower electrode; and
a conductive oxide film above the passivation film and between the passivation film and both the gate wire and the relay electrode, the conductive oxide film being electrically disconnected between the gate wire and the relay electrode,
wherein the first transistor and the second transistor are bottom gate transistors,
an end portion of the source wire is exposed through the passivation film via a second hole in the passivation film, the end portion of the source wire being connectible with a source driving circuit that is outside the thin-film transistor array device,
the conductive oxide film covers the end portion of the source wire that is exposed through the passivation film via the second hole,
the current-supply electrode is electrically connected to the lower electrode via a third hole in the passivation film and the contact hole in the interlayer insulating film,
the conductive oxide film is between the current-supply electrode and the relay electrode and electrically connects the current-supply electrode and the relay electrode, and
the relay electrode comprises a same material as the gate wire.

15. The electroluminescence display panel according to claim 14,
wherein the lower electrode comprises a metal primarily composed of aluminum.

16. The electroluminescence display panel according to claim 14,
wherein the lower electrode and the relay electrode are connected in a flat region extending along a circumference of an upper part of a fourth hole in the passivation film.

17. An electroluminescence display device comprising the electroluminescence display panel according to claim 14.

18. A method of manufacturing a thin-film transistor array device, comprising:
preparing a substrate;
forming a source wire above the substrate;
forming a first transistor including a first transistor gate electrode and a first transistor source electrode above the substrate;

forming a second transistor including a current-supply electrode above the substrate for supplying current;

forming a passivation film above the first transistor and the second transistor;

forming a conductive oxide film above the passivation film;

forming a gate wire above the source wire and transverse to the source wire; and forming a relay electrode above the passivation film that overlaps with the current-supply electrode, the relay electrode being a relay between the current-supply electrode and the lower electrode, wherein the first transistor and the second transistor are bottom gate transistors, the source wire is electrically connected to the first transistor source electrode and below the passivation film in a first layer, the gate wire is above the passivation film in a second layer different than the first transistor gate electrode and electrically connected to the first transistor gate electrode via a first hole in the passivation film, after forming the passivation film and before forming the conductive oxide film above the passivation film, an end portion of the source wire is exposed through the passivation film via a second hole in the passivation film, the end portion of the source wire being formed into a terminal for connection with a source driving circuit that is outside the thin-film transistor array device, the conductive oxide film is formed to cover the end portion of the source wire that is exposed through the passivation film via the second hole, the conductive oxide film is formed between the passivation film and both the gate wire and the relay electrode and divided between the gate wire and the relay electrode, the conductive oxide film is between the relay electrode and the current-supply electrode and electrically connects the relay electrode and the current-supply electrode, and the relay electrode is formed in the second layer and comprises a same material as the gate wire.

19. The method of manufacturing a thin-film transistor array device according to claim 18,
wherein the lower electrode comprises a metal primarily composed of aluminum.

20. The method of manufacturing a thin-film transistor array device according to claim 18,
wherein the gate wire and the relay electrode each include a surface that is in contact with the conductive oxide film and comprises a metal that includes at least one of copper, molybdenum, titanium, and tungsten.

21. The method of manufacturing a thin-film transistor array device according to claim 18,
wherein the first transistor and the second transistor each include a crystalline semiconductor layer, and
the first transistor gate electrode and a second transistor gate electrode included in the second transistor comprise a first metal having a higher heat-resistance than a second metal of which the gate wire comprises.

22. The method of manufacturing a thin-film transistor array device according to claim 18,
wherein the conductive oxide film comprises indium and one of tin and zinc.

23. A method of manufacturing an electroluminescence (EL) panel, comprising:
preparing a substrate;
forming a source wire above the substrate;
forming a first transistor including a first transistor gate electrode and a first transistor source electrode above the substrate;
forming a second transistor including a current-supply electrode above the substrate for supplying current;
forming a passivation film above the first transistor and the second transistor;
forming a conductive oxide film above the passivation film;
forming a gate wire above the source wire and transverse to the source wire;
forming a relay electrode above the passivation film that overlaps with the current-supply electrode, the relay electrode being a relay between the current-supply electrode and the lower electrode;
forming an interlayer insulating film above the passivation film;
forming a lower electrode above the interlayer insulating film;
forming a light-emitting function layer above the lower electrode; and
forming an upper electrode above the light-emitting function layer,
wherein the first transistor and the second transistor are bottom gate transistors,
the source wire is electrically connected to the first transistor source electrode and below the passivation film in a first layer,
the gate wire is above the passivation film in a second layer different than the first transistor gate electrode and electrically connected to the first transistor gate electrode via a first hole in the passivation film,
the lower electrode is electrically connected to a thin-film transistor array device via a second hole in the passivation film and a contact hole in the interlayer insulating film,
after forming the passivation film and before forming the conductive oxide film above the passivation film, an end portion of the source wire is exposed through the passivation film via a third hole in the passivation film, the end portion of the source wire being formed into a terminal for connection with a source driving circuit that is outside the thin-film transistor array device,
the conductive oxide film is formed to cover the end portion of the source wire that is exposed through the passivation film via the third hole,
the conductive oxide film is formed between the passivation film and both the gate wire and the relay electrode and divided between the gate wire and the relay electrode,
the conductive oxide film is between the relay electrode and the current-supply electrode and electrically connects the relay electrode and the current-supply electrode, and
the relay electrode is formed in the second layer and comprises a same material as the gate wire.

* * * * *